United States Patent [19]

Frankle et al.

[11] Patent Number: 5,521,837

[45] Date of Patent: May 28, 1996

[54] TIMING DRIVEN METHOD FOR LAYING OUT A USER'S CIRCUIT ONTO A PROGRAMMABLE INTEGRATED CIRCUIT DEVICE

[75] Inventors: Jon A. Frankle, San Jose; Mon-Ren Chene, Cupertino, both of Calif.

[73] Assignee: Xilinx, Inc., San Jose, Calif.

[21] Appl. No.: 376,138

[22] Filed: Jan. 19, 1995

Related U.S. Application Data

[63] Continuation of Ser. No. 894,500, Jun. 4, 1992, abandoned.

[51] Int. Cl.⁶ .................................................. G06F 17/50
[52] U.S. Cl. ........................ 364/491; 364/488; 364/489; 364/490
[58] Field of Search ................................. 364/488–491, 364/578

[56] References Cited

U.S. PATENT DOCUMENTS

| | | | |
|---|---|---|---|
| 3,617,714 | 11/1971 | Kernighan | 364/468 |
| 4,593,363 | 6/1986 | Burstein | 364/491 |
| 4,630,219 | 12/1986 | DiGiacomo et al. | 364/488 |
| 4,924,430 | 5/1990 | Zasio et al. | 364/578 |
| 5,053,980 | 10/1991 | Kanazawa | 364/578 |
| 5,095,454 | 3/1992 | Huang | 364/578 |
| 5,144,563 | 9/1992 | Date et al. | 364/491 |
| 5,187,784 | 2/1993 | Rowson | 395/500 |
| 5,197,015 | 3/1993 | Hartoog et al. | 364/490 |
| 5,218,551 | 6/1993 | Agrawal et al. | 364/491 |
| 5,224,056 | 6/1993 | Chene et al. | 364/490 |
| 5,237,514 | 8/1993 | Curtin | 364/490 |
| 5,239,493 | 8/1993 | Sherman | 364/578 |
| 5,251,197 | 10/1993 | Finnerty | 364/490 |

OTHER PUBLICATIONS

Suphachai Sutanthavibul, Eugene Shragowitz, "Dynamic Prediction of Critical Paths and Nets for Constructive Timing–Driven Placement", 28th ACM/IEEE Design Automation Conference, Paper 37.4, pp. 632–635, 1991.

Jon Frankle, "Iterative and Adaptive Slack Allocation for Performance–driven Layout and FPGA Routing", 29th ACM/IEEE Design Automation Conference, Paper 34.1, pp. 536–542, 1992.

Kernighan, B. W. and Lin, S., "An Efficient Heuristic Procedure for Partitioning Graphs", The Bell System Technical Journal, pp. 291–307, Feb. 1970.

Quinn, Jr., Neil R. and Breuer, Melvin A. "A Force Directed Component Placement Procedure for Printed Circuit Boards", IEEE Transactions on Circuits and Systems, vol. CAS–26, No. 6, pp. 377–388, Jun. 1979.

Teig, Steven; Smith, Randall L. and Seaton, John, "Timing–Driven Layout of Cell–Based ICs", VLSI Systems Design, pp. 63–73, May 1986.

Dunlop, A. E.; Agrawal, V. D.; Deutsch, D. N.; Juki, M. F.; Kozak, P. and Wiesel, M., "Chip Layout Optimization Using Critical Path Weighting", 21st Design Automation Conference, Paper 9.2, pp. 133–136, 1984.

(List continued on next page.)

*Primary Examiner*—Kevin J. Teska
*Assistant Examiner*—Leigh Marie Garbowski
*Attorney, Agent, or Firm*—Edel M. Young

[57] ABSTRACT

The present invention provides suggested delay limits for use by layout tools which cause a programmable integrated circuit device to implement a logic design. The suggested delay limits can be used by such tools as an initial placement algorithm, a placement improvement algorithm, and a routing algorithm for evaluating and guiding potential layouts. The suggested delay limits take into account characteristics of the programmable device being used by estimating lower bound delays for each connection in a logic design, and take into account any previously achieved delays or achievable delays for each connection in calculating the suggested limits. Results of routing benchmark designs using the novel suggested limits show improved timing performance for all benchmark cases tested.

26 Claims, 19 Drawing Sheets

OTHER PUBLICATIONS

Tsay, Ren–Song and Koehl, Juergen, "An Analytic Net Weighting Approach for Performance Optimization in Circuit Placement", 28th ACM/IEEE Design Automation Conference, Paper 37.2, pp. 620–625. 1991.

Luk, Wing K., "A Fast Physical Constraint Generator for Timing Driven Layout", 28th ACM/IEEE Design Automation Conference, Paper 37.3, pp. 626–631, 1991.

Srinivasan, Arvind, "An Algorithm for Performance–Driven Initial Placement of Small–Cell ICs", 28th ACM/IEEE Design Automation Conference, Paper 37.5, pp. 636–639, 1991.

Donath, Wilm E.; Norman, Reini J.; Agrawal, Bhuwan K.; Bello, Stephen E.; Han, Sang Yong; Kurtzberg, Jerome M.; Lowry, Paul and McMillan, Roger I., "Timing Driven Placement Using Complete Path Delays", 27th ACM/IEEE Design Automation Conference, Paper 6.1, pp. 84–89, 1990.

Kuh, Ernest S. and Jackson, Michael A. B., "Performance–Driven Placement of Cell Based IC's", 26th ACM/IEEE Design Automation Conference, Paper 24.2, pp. 370–375, 1989.

Burstein, Michael and Youssef, Mary N., "Timing Influenced Layout Design", 22nd Design Automation Conference, Paper 9.2, pp. 124–130, 1985.

Hauge, Peter S.; Nair, Ravi and Yoffa, Ellen J., "Circuit Placement for Predictable Performance", pp. 88–91, 1987 IEEE.

Marek–Sadowska, Malgorzata and Lin, Shen P., "Timing Driven Placement", pp. 94–97, 1989 IEEE.

Shragowitz, Eugene and Youssef, Habib, "Timing Constraints for Correct Performance", pp. 24–27, 1990 IEEE.

Jackson, Michael A. B.; Srinivasan, Arvind and Kuh, E. S., "A Fast Algorithm for Performance–Driven Placement", pp. 328–331, 1990 IEEE.

Garbers, J.; Korte, B.; Promel, H. J., Schwietzke, E. and Steger, A., "VLSI–Placement Based on Routing and Timing Information", pp. 317–321, 1990 IEEE.

Hitchcock, Sr., Robert B.; Smith Gordon L. and Cheng, David D., "Timing Analysis of Computer Hardware", pp. 100–105, IBM J. Res. Develop, vol. 26, No. 1, Jan. 1982.

PROPAGATE ACTUAL DELAY FORWARD

PROPAGATE REQUIRED ARRIVAL TIME BACKWARD

CONNECTION SLACK

ADJUSTED DELAY LIMIT

TIMING DRIVEN METHOD FOR LAYING OUT A USER'S CIRCUIT ONTO A PROGRAMMABLE INTEGRATED CIRCUIT DEVICE

This application is a continuation of application Ser. No. 07/894,500, filed Jun. 4, 1992, now abandoned.

FIELD OF THE INVENTION

The present invention relates to converting a circuit design into a physical integrated circuit structure which implements the design. More particularly, the invention relates to laying out the design onto the physical structure so that the layout meets timing requirements specified by a user.

BACKGROUND

Programmable logic devices are available for implementing any of a wide variety of logic designs. The user designs a logic circuit, and uses software to direct a computer to program a logic device or to design a set of masks to implement the desired logic design. Timing of signals passed between parts of the logic device depends in part upon placement of the user's circuit elements into transistor groups in the physical structure and the resultant arrangement of the metal wires. In general, longer wires mean longer delays, the actual timing depending upon capacitances, resistances, and the number of logic elements a signal must traverse. As transistors have become faster, a larger percentage of the delay in passing a signal through the device is contributed by the wiring. Therefore it has become a worthwhile effort to select wiring segments carefully to minimize the delay caused by these wiring segments.

Logic devices which can be programmed using the method of the present invention include both mask and field programmable devices. Mask programable devices are programmed at the factory when the device is being manufactured, and field programmable devices are programmed by the user after purchasing the completed device. Mask programmable devices include gate array structures which have an array of transistor groups formed in the substrate of an integrated circuit, and typically a layer of control gates formed in a layer above the substrate. Above these standard layers are formed personality layers, usually two or three layers of metallization, which interconnect the transistors to create a circuit desired by a customer.

Field programmable devices include programmable logic array (PLA) devices and field programmable gate array (FPGA) devices. PLA devices generally comprise an array of AND gates which provides input to an array of OR gates, and thereby implement logic which is stated as a sum of products. FPGA devices include a plurality of logic blocks or modules connected together by programmable interconnect lines. The programmable blocks can be programmed to implement multiple functions, and the programmable interconnect can be connected together in a wide variety of ways to produce an overall structure which implements the user's design. The detailed description below uses an FPGA in its description; therefore, an FPGA structure will be described in more detail here.

FPGA Structure

FIG. 1 represents a typical island-type field programmable gate array (FPGA) structure. A plurality of configurable logic blocks (CLBs) implement functions selected by a user and must be interconnected to perform an overall function desired by the user. The CLBs of FIG. 1 are shown as having one connecting lead extending in each direction north, south, east, and west from the CLB. There are typically more leads than this in an actual circuit but the figure is representative of the FPGA architecture. Wire segments are provided in the chip for interconnecting these CLBs. The CLB leads may be programmably connected to the wire segments, for example by pass transistors or antifuses. In a mask programmed alternative, the leads and wire segments may be interconnected by opening vias between metal layers.

Also present in the FPGA are switch boxes SBX which selectively interconnect the wire segments to each other at nodes. These switch boxes may offer a variety of internal interconnections between the wire segments which connect to the node. Two examples follow.

The makeup of an SBX may be as shown in FIG. 2A, in which each wire W1–W6 extending from the west is connectable to one wire N1–N6, E1–E6 and S1–S6 from each of the north, east, and south. Connections are made through diamond connectors D1 through D6. In a transistor embodiment the diamond connectors are as shown in FIG. 2B, with six transistors selectively connecting the wires N, E, S, and W together. Such an architecture allows a connection to be formed between any CLB lead and any other CLB lead, though it does not allow for "lane changes", for example allowing a signal placed on segment W1 of FIG. 2B to be connected to segment N2.

A more flexible switching architecture is illustrated in FIG. 3. For simplicity, in FIG. 3, only interconnections from west wire segments are illustrated. It can be seen that west wire W1 can be connected to any of north wires N1 and N2, east wires E1 and E2, and south wires S1 and S2. West wire W3 can also be connected to north wires N1 and N2, east wires E1 and E2, and south wires S1 and S2. West wire W2 can be connected to north wires N2 and N3, east wires E1, E2, and E3, and south wires S2 and S3. Typically, the same choices are provided for each of the other three directions, but for simplicity are not illustrated.

Three types of wire segments are shown in FIG. 1. Wire segment SL is a short segment extending between two switch boxes SBX. Double length wire segment DL extends the distance of two short segments. Wire segment LL is a long line and extends the entire length of the FPGA device, or sometimes half this length. These different length segments are intended for different purposes. The long segments are useful for wide fanout signals such as clock signals, while the double and single length segments are best for local routing. The time delay experienced by a signal routed from one CLB to another will depend upon the kinds of wire segments used and the number of nodes traversed.

Definitions

In a logic design, a conductive route from one source logic block or register to one destination logic block or register is called a connection. Frequently a signal generated at one source must be sent to several destinations. The collection of routes from one source to all destinations is called a net. In the hardware which implements the logic design, a single piece of wire which makes up one part of a connection or net is called a segment. One segment can be interconnected to another at a node. Typically, a wire segment may be interconnected to any of several other wire segments at a node. A path is the set of connections and combinational logic blocks which extend from one package pin or clocked register to another package pin or clocked register.

Motivation to Include Interconnect Wiring in Timing Analysis

If segments are connected at nodes by turning on transistors, the connection will comprise both wire segments and transistors. Since transistors still have finite resistance in their on states, the connection will impose a finite RC delay on the signal path. Further, as feature size decreases, the fraction of delay due to wiring increases. Connection delays have become a significant part of the total delay for transistor connected devices. Even for hard-wired ASIC devices, as feature size has become smaller, wiring has begun to contribute a major part to total delay of signals. In the past, for example when configuring a sea-of-gates ASIC device, most research focused on optimizing placement because this had the most effect on timing. In devices such as FPGAs a variety of routing resources have a variety of time delay characteristics. Therefore routing as well as placement can significantly affect timing of the configured logic device.

Laying Out a Design Onto an Integrated Circuit Logic Device

The software for laying out a user's logic design onto a logic device performs a sequence of steps to convert the user's logic design into a set of commands for programming the hardware to implement the design. Typically these steps include:

1) Design Entry: Either schematic capture of a graphical display of the user's circuit, or the reading of a hardware description language which describes functions to be performed and connections between the functions. Design entry sometimes includes reading a list of states and transitions between states which are to be implemented.

2) Functional Verification and Logic Synthesis: Functional verification comprises checking to see if the user's design makes logical sense (avoids connecting outputs together, for example). Logic synthesis includes logic optimization, which involves rewriting the information entered during design entry to simplify expressions, reduce the number of terms in an equation, reduce the area needed to implement the design or otherwise optimize the user's design.

3) Mapping: involves grouping the user's logic gates into units each of which can be implemented by a corresponding unit of the logic device (for example, by a Xilinx FPGA function generator).

4) Initial Placement: The units of the logic design are divided into portions each of which is assigned to a particular unit of the logic device (for example a Xilinx FPGA logic block). This step may use a min-cut algorithm such as described in a paper by B. W. Kernighan and S. Lin entitled "An Efficient Heuristic Procedure for Partitioning Graphs" published in the Bell System Technical Journal, February 1970 at pages 291-307, or a spring relaxation algorithm such as described in a paper by Neil R. Quinn, Jr., and Melvin A. Breuer entitled "A Force Directed Component Placement Procedure for Printed Circuit Boards" published in the IEEE Transactions on Circuits and Systems. vol. CAS-26, No. 6, Jun. 3 1979, at pages 377-388.

5) Placement Improvement: The initial placement is adjusted to improve some measure of placement quality such as minimizing total wiring length needed for all connections.

6) Routing: Interconnect lines are selected for connecting each of the unit's input and output lines to correspond to connections in the user's design which join partitioned pieces of the user's logic. In general, a route for connecting a signal from a source logic block to a destination logic block is selected by adding segments one step at a time to form a continuous connection between source and destination.

7) Evaluation of Success, and Possible Iterative Improvement Success of the software in placing all logic into the device and routing all lines which interconnect the logic is evaluated, and the speed of the overall device in implementing the user's logic is also evaluated. Typically, either a user desires to process the logic of an entire chip in minimal time (or within a specified time), or a user desires to operate the logic device with the highest clock speed. In either case, performance can be measured in terms of the time required to transfer signals from beginning to end of the slowest path. A path typically goes through one or more logic blocks, and thus may include several connections.

8) Device Programming: Finally, if the above steps have been successful, a bit stream corresponding to connections to be made and not made configures the device to implement the user's design as determined in the above steps. The bit stream is either loaded into the device if the device is an SRAM FPGA, used to address antifuses to be programmed if it is an antifuse FPGA, used to pattern a mask if the device is a mask programmable ASIC, or otherwise used to make the specific connections in the device so that the device performs the function.

Search Algorithms to Establish Connections

The routing problem occurs in many applications, not just routing of interconnect in an integrated circuit FPGA, and has been studied extensively. Many search algorithms have been developed for finding an available connection from a source to a destination. These include a depth-first search in which segments are added to a route until some obstacle stops the progress, and alternative routes are tried until the destination is reached. For another example, a breadth first search tries all possible segments extending from the source, then all possible second segments, etc. until the destination is reached. A more sophisticated algorithm uses direction information about the destination, and searches first in the most likely direction. With any of these algorithms, a path to the destination will eventually be found if it exists. A book by Nils J. Nilsson entitled "Principles of Artificial Intelligence" published in 1980 by Tioga Publishing Company of Palo Alto, Calif., and a book edited by Avron Barr & Edward A. Feigenbaum entitled "The Handbook of Artificial Intelligence: published in 1981 by William Kaufmann, Inc of Los Altos, Calif. and HeurisTech Press of Stanford, Calif. both describe several methods useful for selecting a route between points.

The process of finding connections is typically repeated for each signal to be routed from a source to a destination. As later connections are routed, there are fewer free routing resources, and the connections may become longer and less efficient. The collective result of finding connections will in general depend on which connection was routed first as well as on the algorithm used to route each connection.

Register-to-Register Transfers

A typical logic design uses both clocked registers (flip flops) and unclocked combinational and arithmetic functions. Timing of the overall device (how fast the device can be clocked) characterizes how quickly a signal can propagate from the output of one clocked register to the input of the next clocked register. This in turn depends upon how quickly any logic to be processed between the output of one register and the input of another register will produce its output, and on how quickly the signal can be routed through the connections, i.e., wire segments and nodes which connect the combinational logic blocks positioned along the path from one register to another.

Different transfers may have different timing requirements if the design uses multiple clocks to control the registers.

Improving the Device Performance—Critical Paths

The time delay for each path used can be computed once paths have been selected. Users are generally interested in minimizing the longest delay in propagating a signal between one clocked register and another because this delay determines the maximum clock speed which can be used with the device when it is implementing the user's function. Thus users are typically interested in register-to-register path timing. The performance requirement is often specified in terms of the time required to transfer a result from one register through some combinational logic to another register. One path will usually turn out to be the slowest path, and is termed the critical path. This critical path limits the overall clock speed, and therefore limits the speed of the device. The delay on this critical path must be reduced if the overall speed of the device is to be improved. Therefore, efforts have been made to reduce the delay of the critical path. Extensive work has been done on the subject.

Analysis of Overall Layout vs Decisions about Each Element

The above steps each involve a multitude of detailed decisions about parts of a design. Each of the specific steps is implemented by a specific algorithm. For example, decisions must be made about which logic block in the logic device will implement which logic gate or gates of the user's design (partitioning and placement), and decisions must be made about which wires in the physical device will carry each of the signals from one block to the next. These individual decisions are usually made sequentially by an algorithm which does not take into account the overall device performance. At some point, the results must be evaluated from an overall perspective. The present invention relates to this overall perspective and to ensuring that the individual steps produce a good overall evaluation.

Placement and Routing Tools

Early placement and routing analysis tried to apply results of an overall evaluation of performance by adjusting weights on connections, and used the weights to establish priority for routing and to calculate a measure of goodness. Work by A. E. Dunlop, V. D. Agrawal, and D. N. Deutsch, entitled "Chip Layout Optimization Using Critical Path Weighting," Proc. 21st Design Automation Conference, pp. 278–281, 1984; and M. Burstein and M. N. Youssef, entitled "Timing Influenced Layout Design," Proc. 22nd Design Automation Conference. pp. 124–130, 1985 performed timing analysis using delay estimates for connections, and gave signals on critical paths higher weight during partitioning or higher priority during routing. Work by S. Teig, R. L. Smith, and J. Seaton, entitled "Timing-driven Layout of Cell-based ICs," VLSI Systems Design, pp. 63–73, May 1986, highlighted the importance of interactions between timing analysis and the place-and-route steps. But a method of assigning weights to critical paths was not described. The Teig et al. work described only generally how to relate timing to placing and routing. A paper by M. Marek-Sadowska and S. P. Lin entitled "Timing Driven Layout of Cell-Based ICs," Proc. ICCAD '89, pp. 94–97, 1989 described a recursive mincut algorithm for initial placement, in which non-critical connections were given weights in inverse proportion to their slacks. Slack is the difference between time allowed to complete a transfer and the time used for that transfer. Critical paths (those with low or negative slack) were given slightly higher weights than non-critical paths. In a paper by J. Garbers, B. Korte, H. J. Promel, E. Scheietzke, and A. Steger, entitled "VLSI-Placement Based on Routing and Timing Information," Proc. European Design Automation Conference, pp. 317–321, 1990, improved performance was obtained by recursive partitioning and approximate routing (selecting the general area of a chip in which the routing is to be allocated but not selecting the particular lines to be used) using a re-weighting scheme in which a routing connection's weight is simply incremented by one at any stage it is found to be on a critical path. The evolving weights influence both partitioning costs and routing order.

A problem which occurs with these weight adjustment methods is that the solution can oscillate. As critical paths are improved, other paths may become critical, and a second iteration may not produce a better result than the first iteration. Thus, weight adjustment methods do not in general proceed monotonically to a good result.

Dynamic Methods in which Timing Analysis is Repeated after Small Layout Changes

Another approach has been to perform layout (layout refers to the overall function of assigning all logic, registers, and connecting lines in a user's schematic to corresponding elements in the physical device, and includes mapping, placement, and routing) with frequent interaction between the overall analysis of the device performance (accounting for path delays) and the layout process (the selection of positions for individual elements and lines). In a conference paper by W. E. Donath, R. J. Norman, B. K. Agrawal, S. E. Bello, S. Y. Han, J. M. Kurtzberg, P. Lowy, and R. I. McMillan entitled "Timing Driven Placement Using Complete Path Delays," Proc. 27th Design Automation Conference, pp. 84–89, 1990, the timing analysis is updated after one or a few moves during placement. Linear programming has been used at each stage of recursive partitioning to dynamically track path constraints during placement, as described by M. A. B. Jackson and E. S. Kuh, in a paper entitled "Performance-Driven Placement of Cell Based ICs," Proc. 26th Design Automation Conference, pp. 370–375, 1989. Related work by M. A. B. Jackson, A. Srinivasan, and E. S. Kuh entitled "A Fast Algorithm for Performance-Driven Placement," published in Proc. ICCAD '90 pp. 328–331, 1990 and by A Srinivasan entitled "An Algorithm for Performance-driven Initial Placement of Small-Cell ICs," published in Proc. 28th Design Automation Conference, pp. 636–639, 1991 used quadratic programming and reduced the number of delay requirements or constraints which must be considered in selecting the placement of a block of logic to achieve high performance placements more efficiently.

A paper by R. S. Tsay and J. Koehl entitled "An Analytic Net Weighting Approach for Performance Optimization in Circuit Placement, "in Proc 28th Design Automation Conference, pp 620–625, 1991 provides a formula for connection re-weighting which requires as inputs from timing analysis a set of precise limits on individual connection delays. The task of transforming the results of timing analysis into guidance for placement and routing is not trivial, as evidenced by the many heuristics that have been proposed.

Slack

When a timing requirement in one connection of a logic design fails to be met but a timing requirement in another connection of the logic design is met with time to spare, it is often possible to adjust element positions and routes so that timing of the connection with room to spare is made slower in order to speed up that connection which failed to meet a requirement, with the result that all connections and paths meet the requirements. The room to spare is called slack. The slack of a path is defined as $R(p)-A(p)$ where $R(p)$ is the required propagation time along path p, and $A(p)$ is the actual total propagation time along path p. Positive slack indicates a connection was made with time to spare. Negative slack indicates that a timing requirement has not been met. Near-zero (positive) slack means a timing requirement is barely met. Paths which have been routed so that they have positive slack can be rerouted to have less positive slack if that action allows other paths with negative slack to be rerouted so that they meet a timing requirement.

Slack Calculation for Connections of a Path

In a typical circuit, there will be both fan-in (multiple signals entering an element) and fanout (output signals applied to more than one element). R. B. Hitchcock, Sr., G. L. Smith, and D. D. Cheng, in "Timing Analysis of Computer Hardware,", IBM J. Res. Develop., Vol. 26, No. 1, pp. 100–108, 1982, described how to compute slacks of individual connections. The slack of a connection, slack(c), is computed as $$slack\ (c) = R\ (c) - A\ (c) \qquad (1)$$

where:

$R(c)$ is the earliest required arrival time of a signal at the output end of connection c $A(c)$ is the latest actual arrival time of a signal at the output end of connection c Two linear time computations are performed to calculate slack(c). FIG. 5 illustrates an example problem which includes both fan-in and fan-out and which shows how the slack of individual connections is determined from known connection delays and an overall path requirement. The overall requirement is that signals arrive at the three destinations R904, R905, and R906 within 30 nanoseconds after signals are applied to registers R901, R902, and R903. This requirement is illustrated by the numbers "30" in the destinations R904, R905, and R906. Connection delays are illustrated in ovals positioned on the respective connections C901 through C913. These connection delay numbers represent the delay due to length of wire in the segments of the connection and will include propagation delay for signals internal to a block or register plus set-up delay for signal switching time as a signal enters a register.

The calculation of actual arrival times A(c) propagates forward from points at which arrival times are known (or forward from a reference point). As shown in FIG. 6, actual arrival times are shown at inputs to the blocks. Arrival times at R901, R902, and R903 are shown as 0 nanoseconds. Delays in the connections are added to these times to produce arrival times at inputs to subsequent blocks. For simplicity, delay within a block is accounted for in the delays of its outgoing connections. When several signals are applied to a block, the latest arrival time must be used, since the output signal from that block is not a valid signal until the last input signal has arrived. For example, connection delays of 3, 4, and 2 nanoseconds respectively for connections C902, C903, and C904 cause signals to arrive at block B902 at times 3, 4, and 2 respectively. The latest of these, a time of 4 nanoseconds, becomes the time at which an output signal is present on the output terminal to connection C908, causing an input signal to arrive at block B904 at 8 nanoseconds. In this manner, delays are propagated forward through the circuit.

As shown in FIG. 7, the required arrival time R(c) is propagated backward from the register at which it must arrive. The connection delay of 7 nanoseconds at connection C909 means that for a signal to reach destination R904 by 30 nanoseconds, it must exit R901 by 23 nanoseconds. Another requirement derived from the destination R905 requirement and connection C910 is that the signal must exit R901 by 24 nanoseconds to reach destination R905 by 30 nanoseconds. But destination R904 has imposed an earlier required arrival time. However, a still earlier requirement of 20 nanoseconds is imposed on R901 by R905 in combination with connections C912 with a delay of 3 nanoseconds, C908 with a delay of 4 nanoseconds, and C902 with a delay of 3 nanoseconds. Thus the required exit time from R901 imposed by the requirement that signals arrive at R904, R905, and R906 by 30 nanoseconds is that the signal exit R901 by 20 nanoseconds. The calculation of required arrival times R(c) propagates backward through the connections from the points at which the requirements are specified.

At any connection, it is possible to calculate slack by subtracting the latest actual arrival time at that connection from the earliest required arrival time at that connection. FIG. 8 shows slacks S for each of the connections as determined by propagating actual arrival time forward to that connection and required arrival time backward to that connection.

Zero-Slack Algorithm

P. S. Hauge, R. Nair and E. J. Yoffa in a paper "Circuit Placement for Predictable Performance," in Proc. ICCAD '87, pp. 88–91, 1987 introduced the zero-slack algorithm (ZSA). This algorithm begins by setting an initial set of connection delays which add up to less than a user's requirements, and computing slacks based on these initial connection delays. These initial delays are replaced by connection delay limits which use up the available slack such that any path having each of its connection delays equal to its limit would just meet the user's requirements. These connection delay limits are then used by placement and routing tools to select acceptable positions and routes for the circuit elements and connections. The limits guide the placement and routing tools to select satisfactory positions and routes more easily than would be possible with tighter requirements, yet assure that if each connection meets its connection delay limit, the overall timing requirements will be met. The zero-slack algorithm tools use path slack information to determine limits by distributing the slack of a path p to the individual connections on path p. According to Hauge et al., slack is distributed uniformly among connections on a path. Alternatively, as described by W. K. Luk in a paper entitled "A Fast Physical Constraint Generator for Timing Driven Layout," Proc. 28th Design Automation Conference, pp. 626–631, 1991, slack can also be distributed in proportion to physical measures, e.g., capacitance per fanout or capacitance change per fanout.

The delay limits are suggestions which, if universally obeyed, would meet a user's requirement. The user's requirement may still be satisfied when some suggested delay limits are not met if other limits are met with room to spare.

In a paper by H. Youssef and E. Shragowitz entitled "Timing Constraints for Correct Performance," Proc. ICCAD '90, pp. 24–27, 1990, the slack of a path is distributed to its connections in proportion to the function $$\text{weight (c)} = LF(c) * AcL(c) \quad (2)$$

where

LF(c) is the delay per unit load (fanout) on the source pin (logic block output) of connection c, and AcL(c) is the capacitance presented by connecting the load to connection c. Thus Youssef and Shragowitz attempt to distribute slack to portions of a path according to the delay which is likely to occur on that part of a path.

An iterative procedure for distributing slack of a path to the connections in the path is described in the above paper. A fraction f(c) which represents that portion of the total slack to be distributed to connection c is computed as $$f(c) = \text{weight}(c)/\max[\text{weights (p)}] \quad (3)$$

where:

weight (c) is weight of the connection c as determined from the formula in equation 2 above, weight (p) is the weight of a path p and is the sum of all connection weights on path p, max[weights (p)] is the maximum weight (p) of those paths that include connection c.

In each iteration, allowable delay U(c) of a connection is increased by f(c) * slack(c). Thus, $$U(c)_{new} = U(c)_{old} + (f(c) * \text{slack}(c)) \quad (4)$$

FIG. 9 shows calculations of new delay limits $U(c)_{new}$ based on adding to old delays $U(c)_{old}$ the value of f(c) * slack(c). The formula for fraction f(c) never distributes so much slack that the slack of a path becomes negative. Existing methods do not make use of information about what values of connection delay are realistic. For example, if initial delays are assumed to be zero, (suggested by Youssef and Shragowitz), some suggested delay limits U(c) may be too small to achieve. On the other hand, if initially the delay limits are assumed to be "physically reasonable" (suggested by Hauge et al., supra) the suggested delay limits may be unnecessarily large. Either way, suggested delay limits do not provide the best guidance for layout tools which will use the suggested limits.

What is needed is an optimized set of suggested upper limits on connection delays.

SUMMARY OF THE INVENTION

Given a partially completed layout, each suggested delay limit U(c) should be attainable in a finished version of that layout. Therefore, limits should be chosen that have the best chance as a set of being achieved. The present invention suggests delay limits based on information about lower bound delays and achieves iterative improvement in suggested delay limits by examining achieved delays in an earlier layout.

The present invention achieves a layout of a user's logic design onto a logic device which meets specified timing constraints by suggesting delay limits for the connections of a path which can be used as guides to layout tools. According to the invention, when suggested delay limits are being calculated for use of layout tools (partitioning, placement, and routing algorithms), initial values of the delay limits are set to be the lower bound delays which can be achieved using the fastest route for a connection. Setting the starting values for computing delay limits at the lower bound values assures that no delay limit will be suggested which is faster than can be achieved.

To evaluate collective achievability the present invention uses information on achieved delays in layouts already attempted. According to the present invention, when improving performance of a laid out design, the present invention uses both lower bound delay limits and already achieved delays in computing suggested delay limits for iterative timing improvement. In a preferred embodiment, the suggested delays are a fraction of the difference between achieved delay and lower bound delay in which the fraction f(c) is computed from the formula $$f(c) = \text{weight}(c)/\max[\text{weight}(p)]$$

where weight (c) = D(c) – L(c)

D(c) = estimated or achieved delay for connection c

L(c) = lower bound achievable delay for connection c weight(p) = Σ weight (c) for all connections c on path p max [weight (p)] is weight (p) on the slowest path using connection c.

Thus suggested delay limits are proportionally adjusted according to differences between achieved delays and lower bound achievable delays. During improvement, limits on connections with negative slack are adjusted down and those with positive slack are adjusted up. Thus limits suggested to a layout tool for iterative improvement attempt to meet tighter path constraints by assigning connection delays according to the difficulty of meeting the tighter limits on the individual connections.

DETAILED DESCRIPTION OF A PREFERRED EMBODIMENT

The method of the present invention operates both while an initial layout step is being determined and while iterative improvement over this initial layout is being formulated. Novel features of the present invention include consideration of lower bound achievable delays and a new delay limit calculation. The path analysis method of the present invention is preferably used during initial placement of logic elements into logic blocks, placement improvement, and routing of connections between the logic elements.

Iterative Interaction Between Path Analysis and Layout Tools

Figure 1:
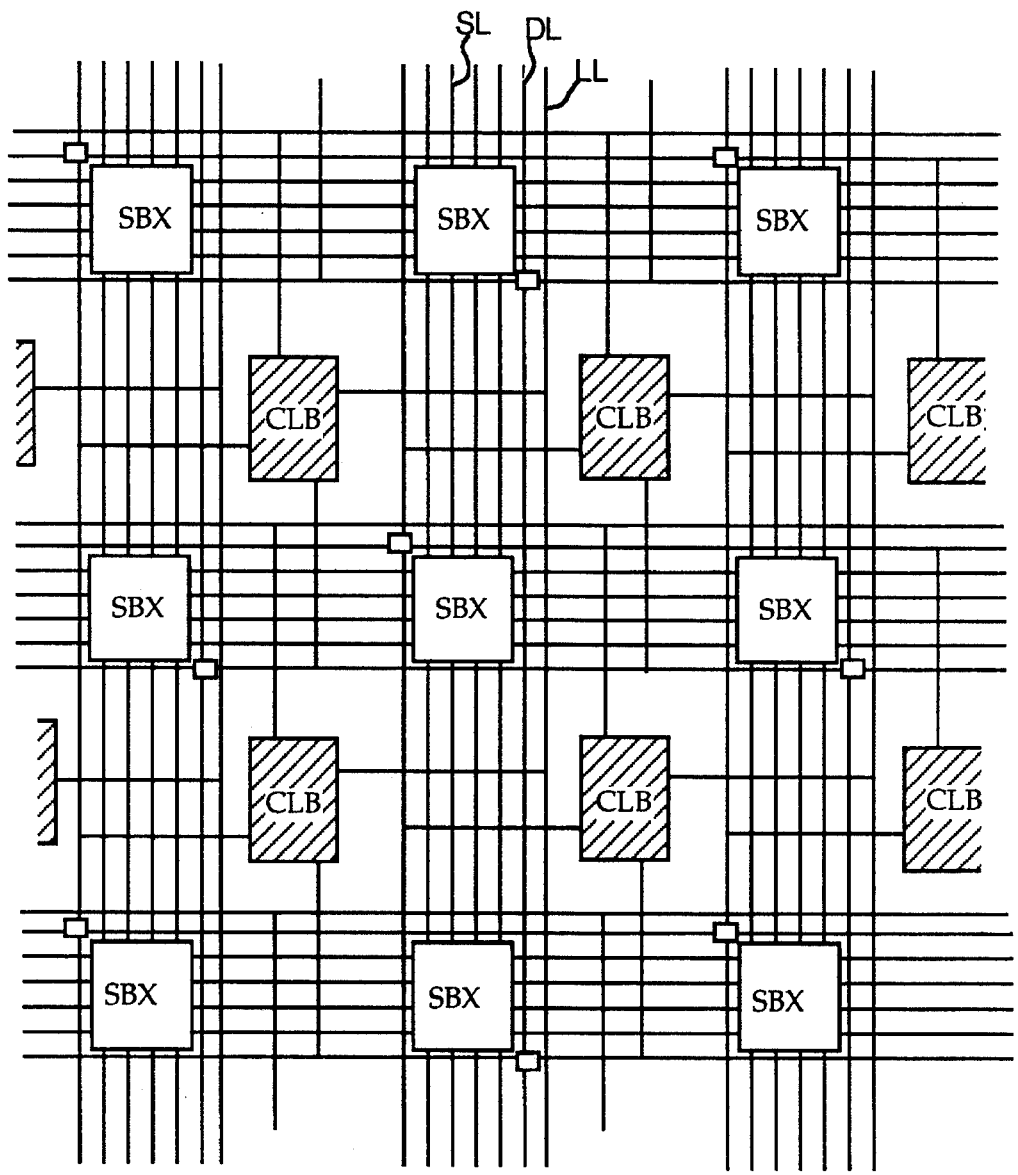
FIG. 1 illustrates a Xilinx prior art FPGA architecture.
Figure 2A:
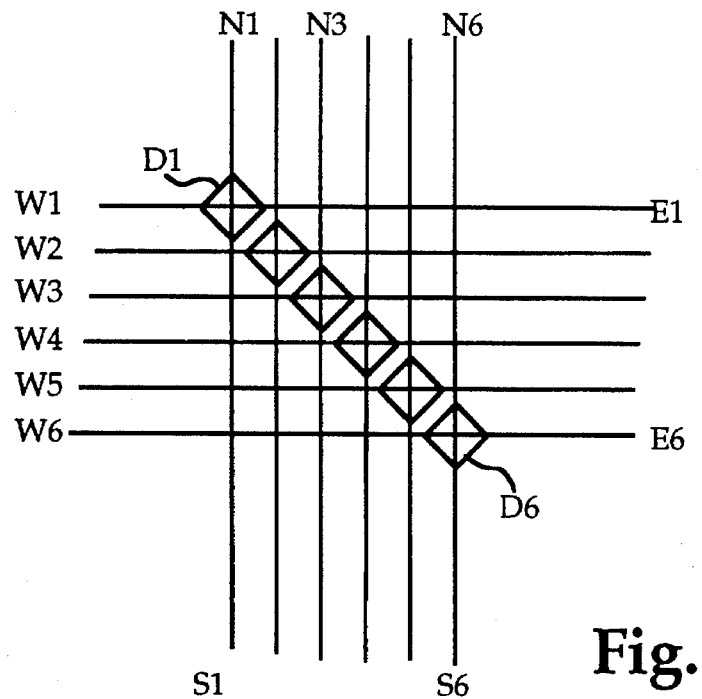
FIGS. 2A and 2B illustrate a simple implementation of a switchbox SBX shown in FIG. 1.
Figure 2B:
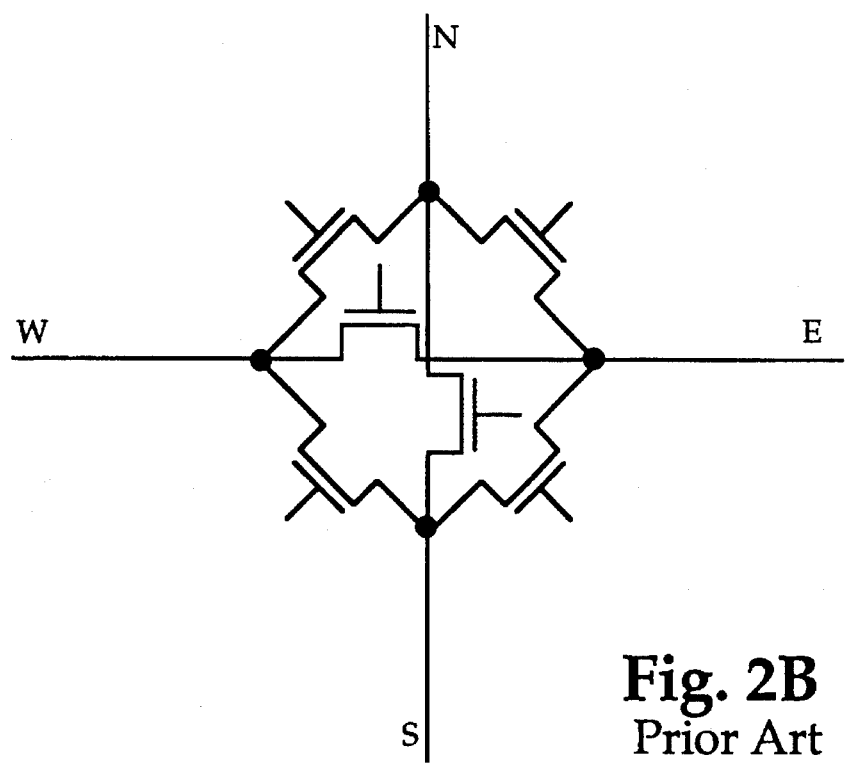
Figure 3:
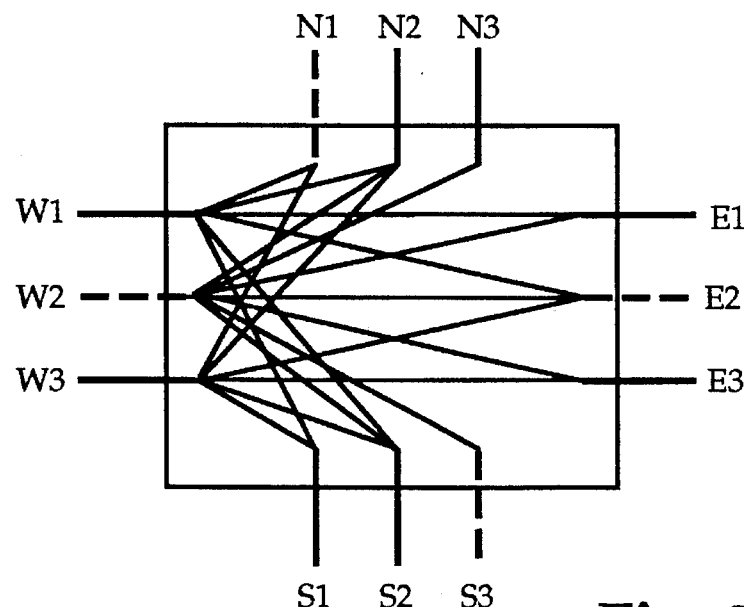
FIG. 3 illustrates a more flexible switchbox SBX, showing connections available to west wires.
Figure 4:
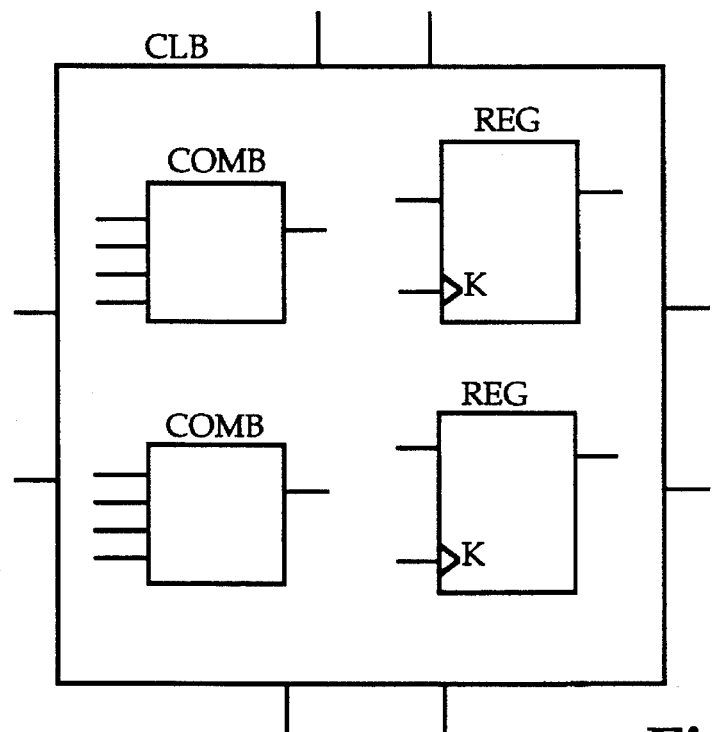
FIG. 4 illustrates a logic block used in Xilinx FPGA devices.
Figure 5:
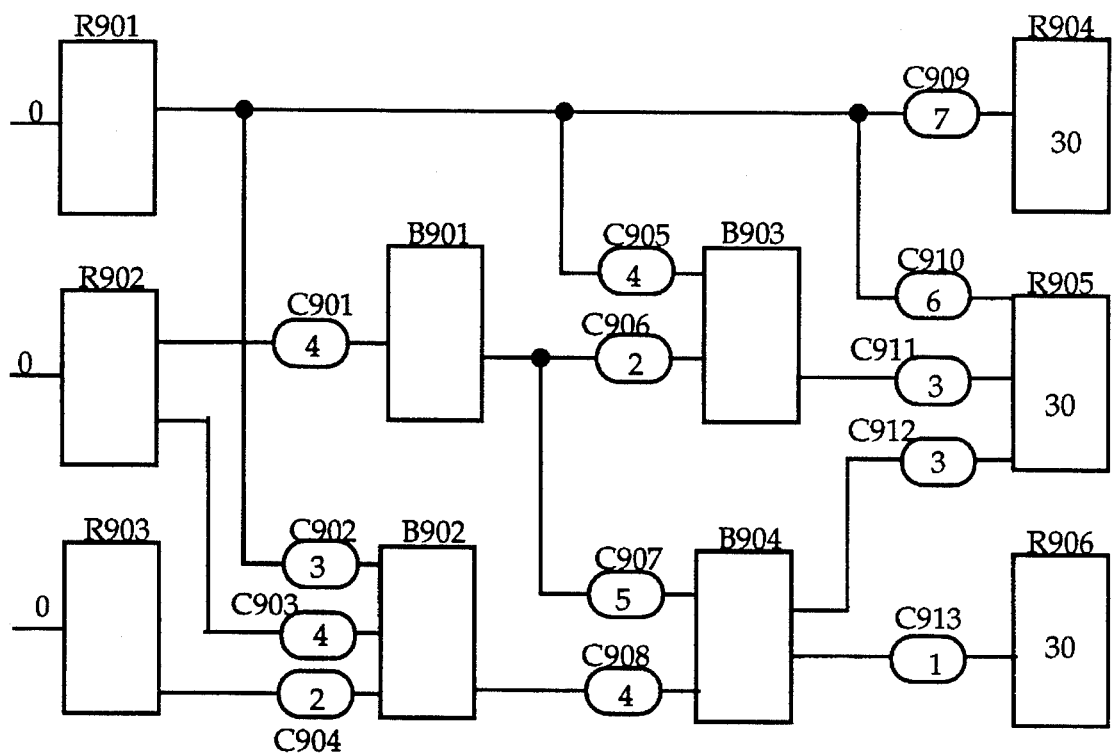
FIG. 5 illustrates an example circuit design showing logic elements or registers interconnected by connections having specified delays.
Figure 6:
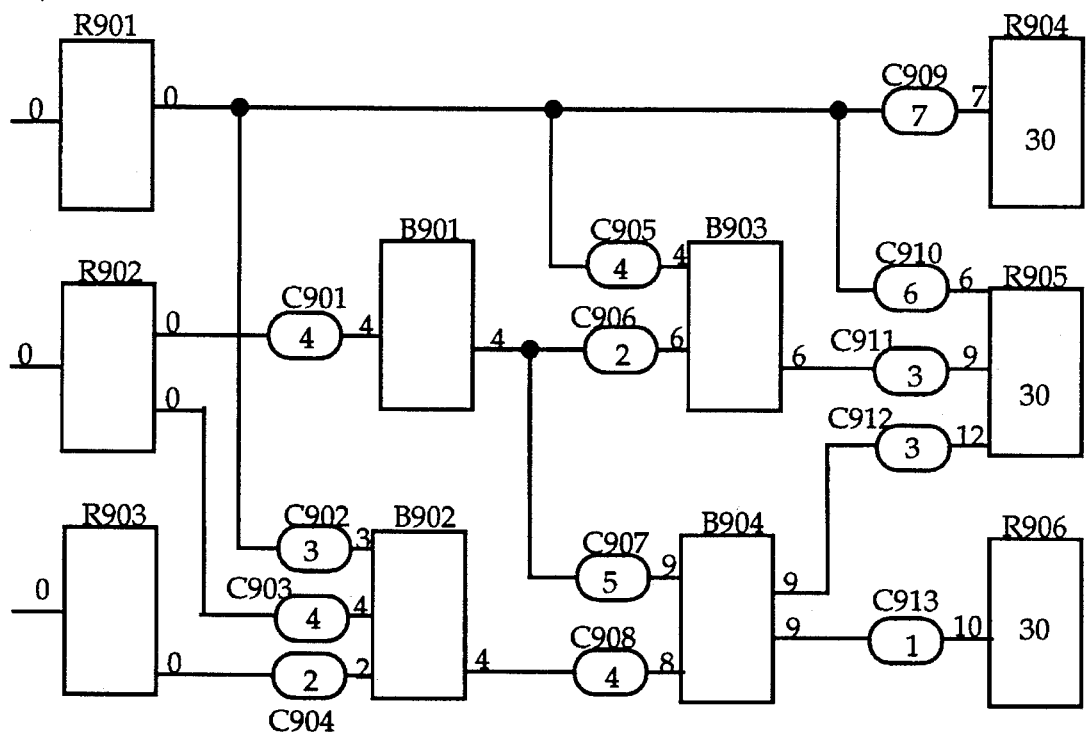
FIG. 6 shows propagation of actual arrival time forward from a known point.
Figure 7:
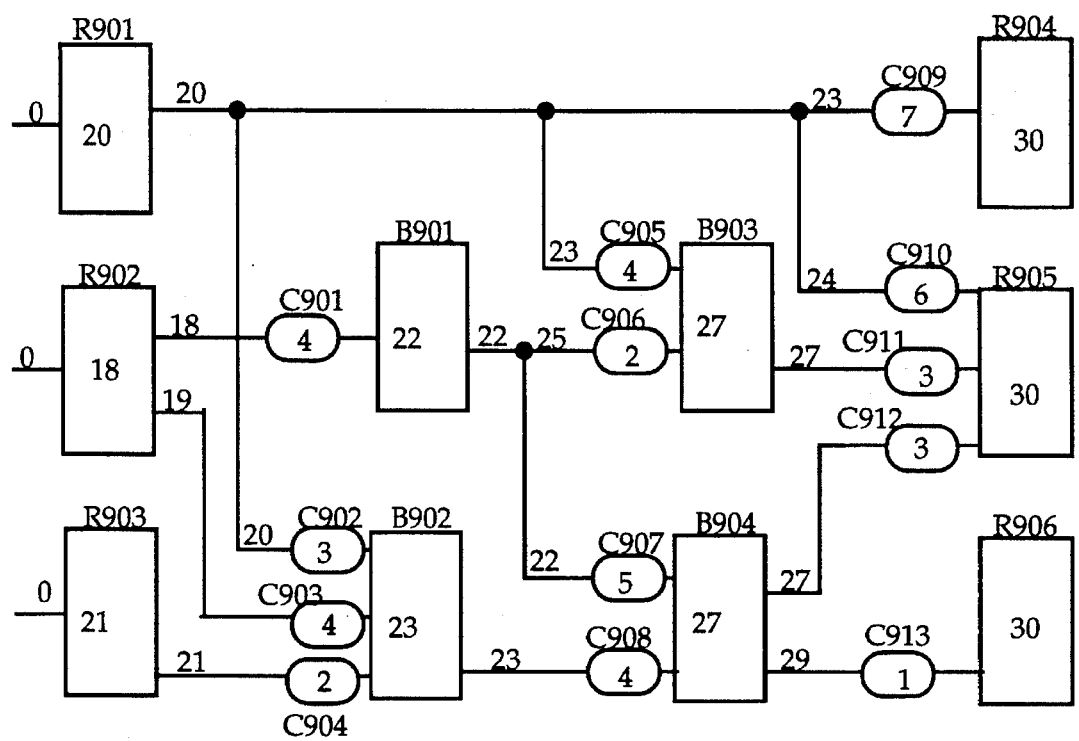
FIG. 7 shows propagation of required arrival times backward from a destination.
Figure 8:
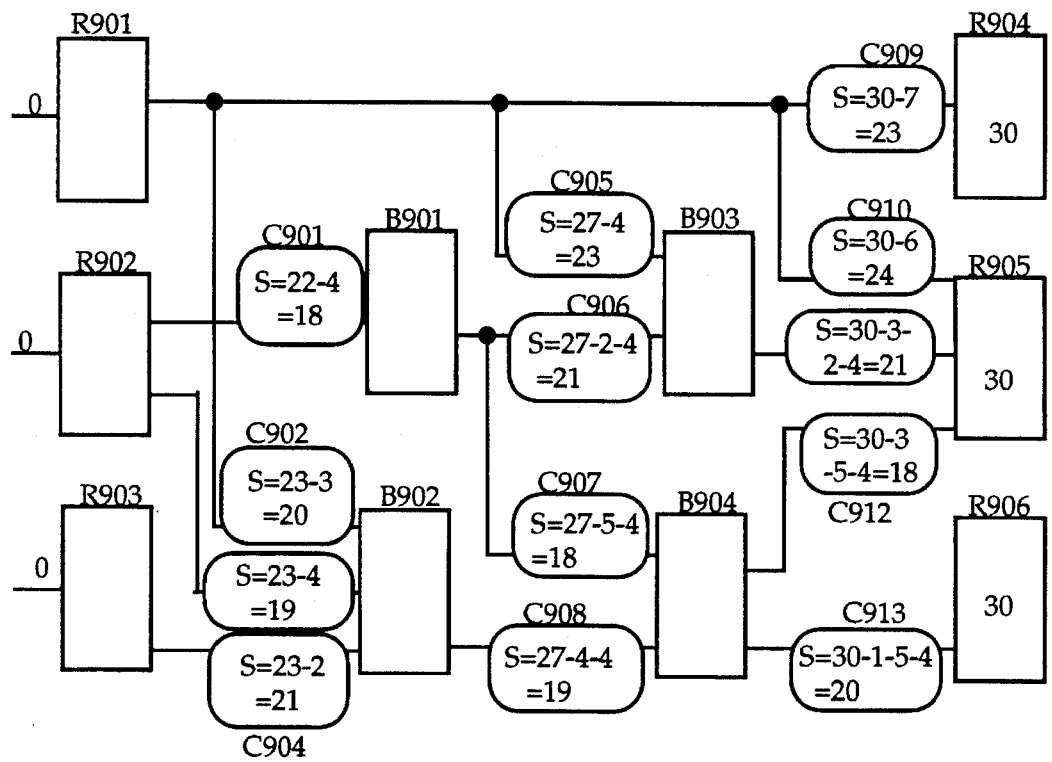
FIG. 8 shows slack available at each connection determined from the actual and required arrival times of FIGS. 6 and 7.
Figure 9:
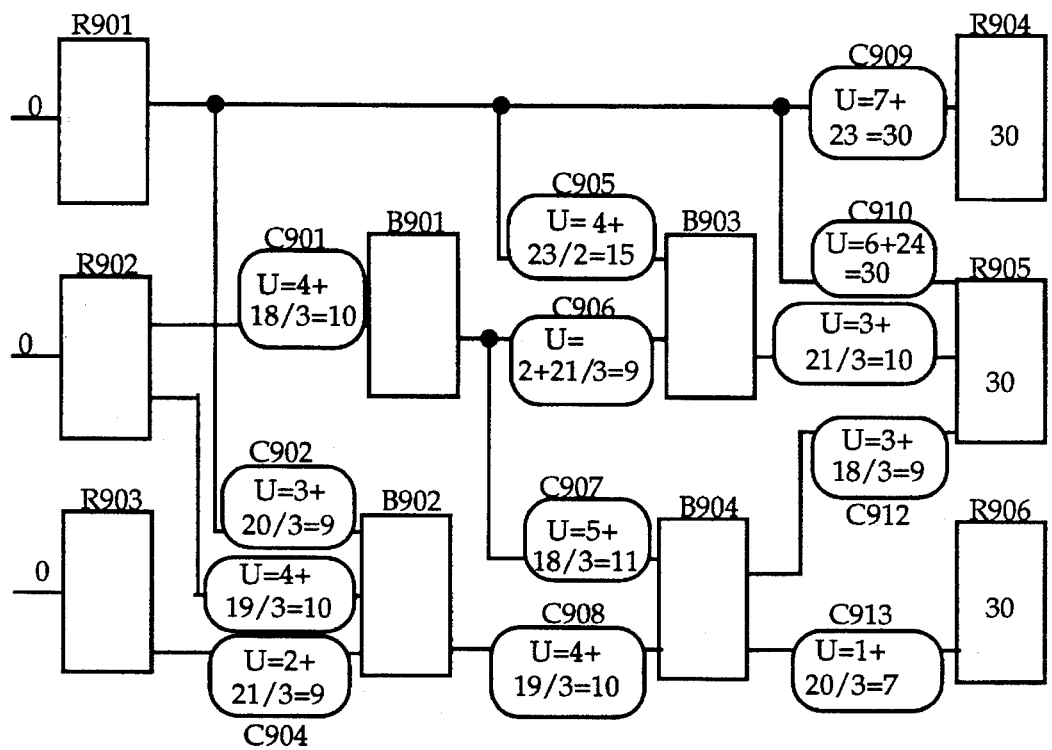
FIG. 9 shows a slack distribution according to the zero-slack algorithm.
Figure 10:
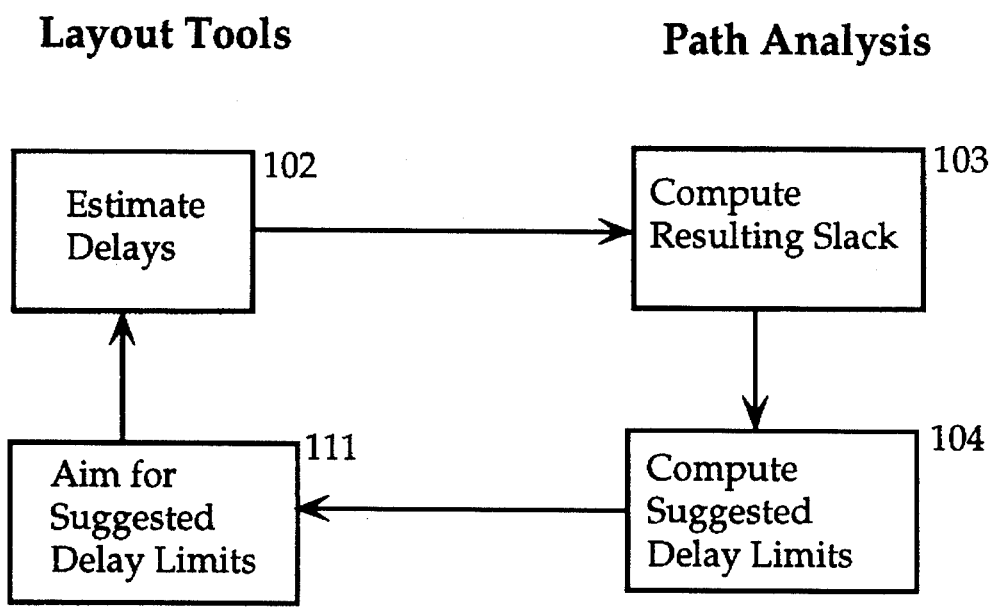
FIG. 10 shows the flow of steps used to layout a design using the slack allocation method of the present invention.

FIG. 10 shows the flow of steps in which the present invention is used to achieve iterative improvement. The flow of steps iterates back and forth between the layout tools, which select partitioning of the logic or select positions or routes for elements of the user's design, and the path analysis tool which evaluates the entire layout in terms of timing (performance), and suggests delay limits to be used by the layout tools. Initially, step 102 of estimating delay is performed after some activity of a layout tool, for example after a first cut by a mincut partitioning algorithm, or after routing some or all of a user's design. In step 103, the path analysis tool of the present invention compares estimated (or actual) delays to any timing requirements which have been specified by a user, and computes resulting slacks. The prior art Hitchcock method discussed in connection with FIGS. 5–9 is preferably used to compute connection slacks. From these slacks, at step 104, a novel method is used to compute suggested delay limits for each connection in the design. These limits are then used in step 111 by the layout tools in an attempt to improve each position or route to meet all suggested delay limits. When Step 111 is completed, the layout tools may return to step 102 and calculate new delays for the new connections. The path analysis process of steps 103 and 104 is then repeated again, new slacks being computed, and new delay limits being suggested.

Step 103 takes connection delays from step 102 and estimates delays of paths, which typically comprise several connections and several logic blocks. A preferred method considers four types of paths and related time delays:

pad-to-pad: the time delay from when a signal is placed on an input pad until the signal reaches an output pad by way of a path which does not include any intermediate registers;

pad-to-setup: time delay from an input pad to a register input plus any additional time required to stabilize the voltage level of a switched signal;

clock-to-pad: the time delay from a register output to an output pad plus the time delay between when a clock signal switches to the time a stable signal is present at the register output; and register-to-register: the time delay from a register output to another register input plus the time delay between when the clock signal switches and the signal is present on the register output plus the time delay from when a signal reaches the register input until the voltage level of a switched signal is stabilized.

Thus internal delay times are added to wire segment delay times and logic block delay times to estimate the total delay of the path. This activity is performed by the layout tools. As mentioned in the prior art discussion of steps used to determine layout, the partitioner partitions the design into logic elements to be implemented by logic blocks, the placer positions the logic elements into logic blocks, and the router selects wire segments which route connections between the logic blocks. Each tool preferably includes means for estimating connection delays resulting from its actions.

Lower Bounds

The present invention relates to step 104, in which suggested delay limits are computed, and which is discussed in detail below. The suggested delay limits are supplied to the layout tool as guides for revising the layout in step 111, a step which handles individual connections between logic blocks and does not evaluate total path delay. Lower bound delay estimates for each connection are determined at step 104, either from values input by a designer, or preferably by generating a table of lower bound delays for the chip being used as a function of the coordinates of the connection end points. These lower bound delays are used in computing the suggested delay limits for each connection. Suggested delay limits can be used, for example, at the following stages of layout: initial placement, placement improvement, and routing.

As with other steps which use the invention, the best available lower bound connection delays (during initial placement and placement improvement accurate lower bounds are not known) are used at step 104 for computing suggested delay limits.

Limit Adjusting Algorithm

Figure 11:
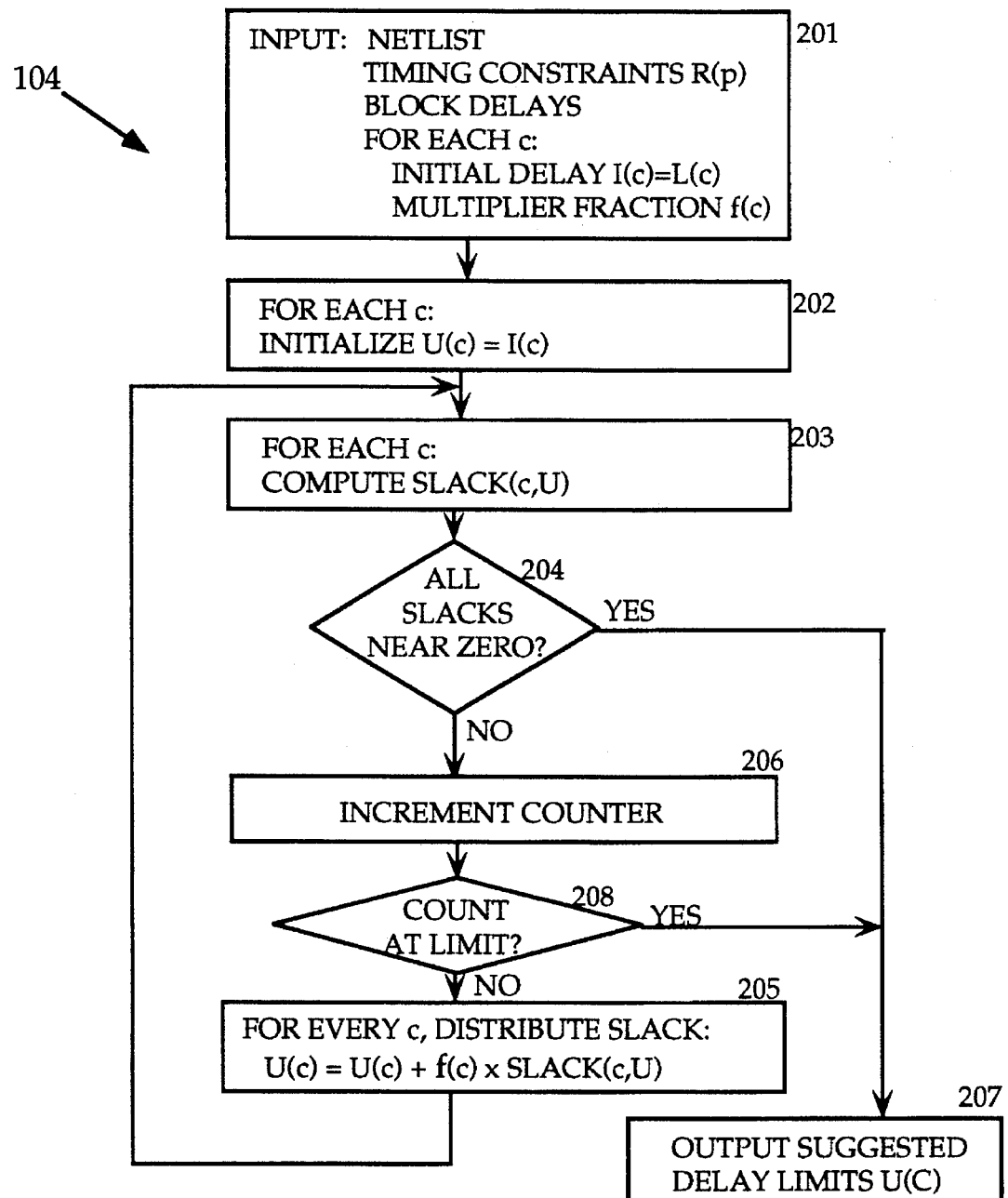
FIG. 11 shows the flow of steps used in a limit adjusting algorithm according to the present invention.

FIG. 11 shows the flow used by the path analysis tools at Step 104 of FIG. 10 to compute a set of suggested delay limits used initially in partitioning, placement, and routing. Lower bound connection delays are used when setting upper limit connection delays $U(c)$ to assure that upper limits are never set below the lower bound delays. Without considering this lower bound, an unsatisfiable upper limit $U(c)<L(c)$ could result. This is true even in designs for which layouts exist that meet the timing constraints.

The lower bound connection delays, $L(c)$ are used as inputs $I(c)$ to the limit adjusting algorithm.

In step 104, the present invention uses a limit adjusting algorithm which generalizes on the prior art method of iteratively distributing slacks. FIG. 11 shows steps used in implementing this limit adjusting algorithm. As was taught by Youssef and Shragowitz, at step 205, for each connection the product of $f(c)$ and the current slack of connection c is added to the suggested delay at connection c. However, $f(c)$ is not necessarily computed by the formula established in the prior art. Terms used in the limit adjusting algorithm of FIG. 11 are:

$U(c)$=the suggested delay limit for connection c $I(c)$=an initial delay for connection c slack$(c,U)$=slack on connection c given the set of delays U $f(c)$=a multiplier fraction for distributing slack $L(c)$=lower bound achievable connection delay As shown in step 201, inputs to the limit adjusting algorithm are:

a netlist, which is a list of logic block inputs and outputs to be connected together timing constraints (which may include clock speed or timing between package pins)

block delays, which are the delays internal to each logic block, and for registers include setup and clock-to-output delays for each connection:
  initial delay I (c), which according to the invention is set at the lower bound $L(c)$
  a multiplier $f(c)$ which indicates what fraction of the connection slack is to be added to the connection In step 202, the limit adjusting algorithm initializes $U(c)=I(c)$ which is set at the lower bound $L(c)$ for each connection c. At step 203, a slack for the connection, slack$(c,U)$, is computed. As shown in step 204, if slacks are close enough to zero, go to step 207, and output the delay limits; otherwise, as shown in step 205, slacks are distributed to each connection c using the formula $$U(c)_{new}=U(c)_{old}+(f(c) * slack\ (c,U)) \quad (5)$$

As shown in FIG. 11, steps 203 and 205 of computing and distributing slacks are repeated until undistributed slacks are sufficiently near zero. Eventually, step 207 is reached and delay limits are provided to the layout tools for a further iteration.

Figure 12A:
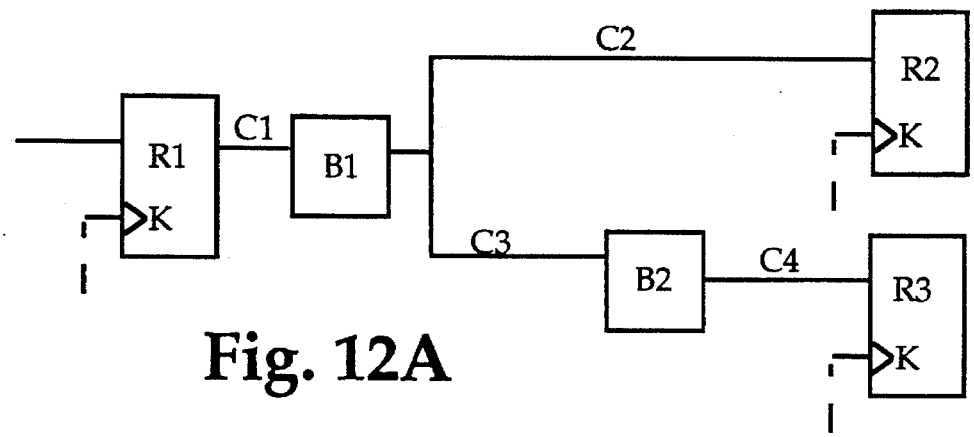
FIG. 12A shows an example net, which is part of a logic design.

FIG. 12A shows a small example portion of a logic design comprising three registers R1, R2, and R3, combinational blocks B1 and B2, and connections C1 through C4 interconnecting these blocks and registers. An output signal from register R1 is carried on connection C1 to block B1. The output of block B1 fans out on connection C2 to register R2 and on connection C3 to block B2, which provides output on connection C4 to register R3.

Figure 12B:
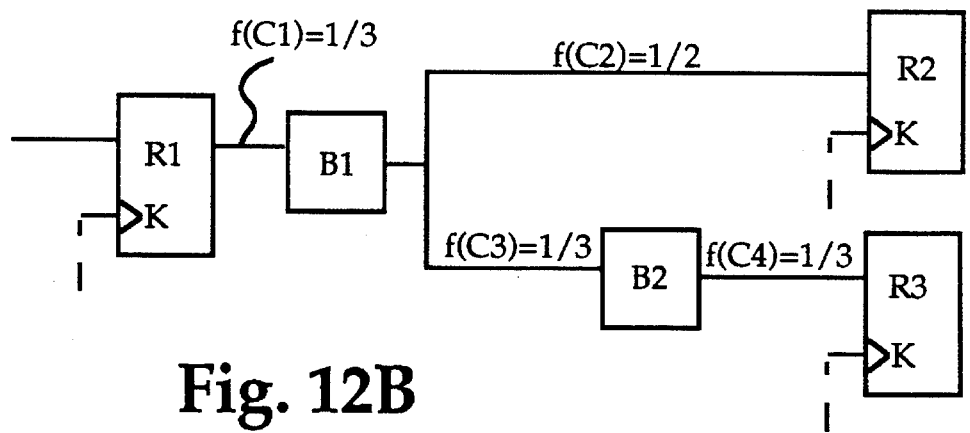
FIG. 12B shows fractional multipliers f(c) attached to each connection in the example net of FIG. 12A.

FIG. 12B shows the example circuit of FIG. 12A with slack distributed using the function $$f(c)=1/\text{max length path through connection c} \quad (6)$$

As shown in FIG. 12B, the path from R1 to R3 uses three connections C1, C3, and C4. The shorter path to R2 uses two connections C1 and C2. Since the longest path uses three connections each connection on this longest path is assigned a fraction ⅓. Since the path from R1 to R2 uses only two connections, one might consider assigning a fraction of ½ to each of connections C1 and C2 on this path. But since the maximum length path through connection C1 is three connections, the smaller fraction $f(C1)$ of ⅓ prevails.

Figure 12C:
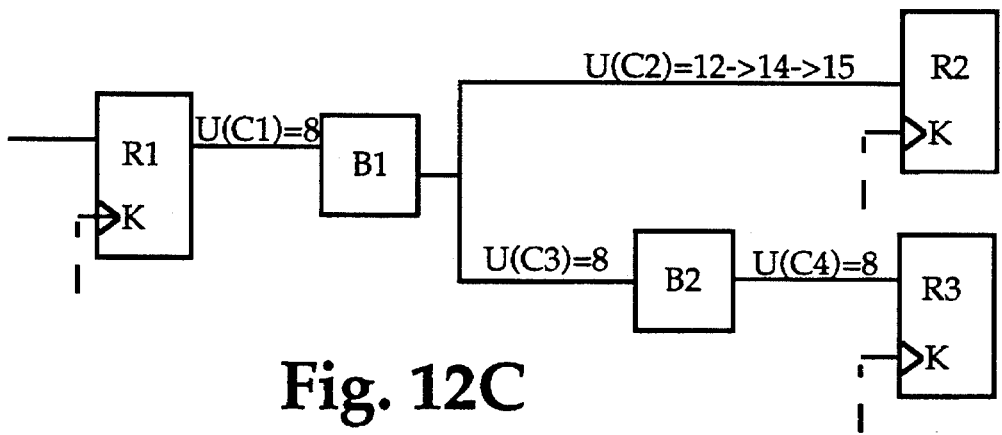
FIG. 12C shows upper limit time delays for each connection in the net determined by multiplying the fractions of FIG. 12B by a path timing constraint.

If a goal of register transfer within 24 nanoseconds has been specified, and delays were initialized at zero, (not according to the invention) the fractions of FIG. 12B would produce the delay limits shown in FIG. 12C.

Delays Achieved by Layout Tools

After a set of suggested delay limits has been generated by the path analysis of step 104 (FIG. 10), these limits are provided to the layout tool, which at step 111 revises the layout in an attempt to meet the limits.

Figure 12D:
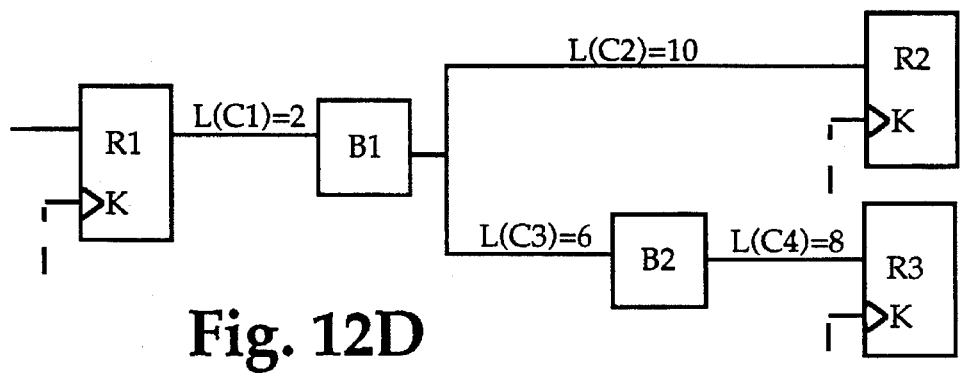
FIG. 12D shows lower bound connection delays for the net of FIG. 12A.
Figure 12E:
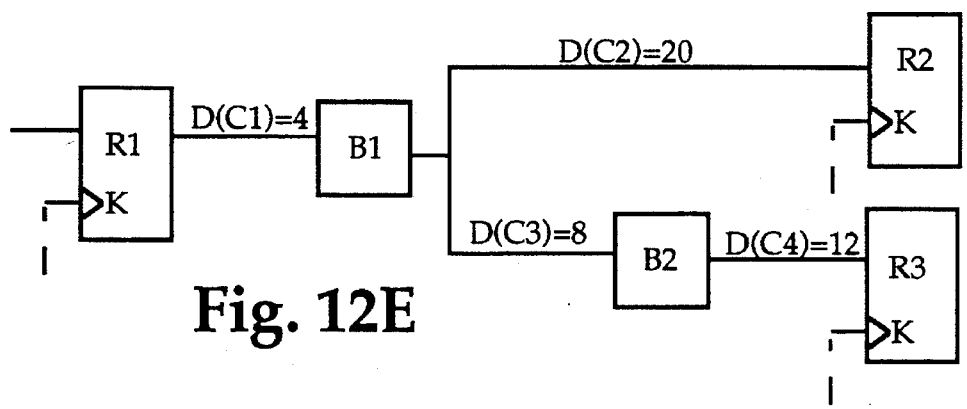
FIG. 12E shows delays achieved on the net of FIG. 12A after a layout has been completed.

FIG. 12E shows a set of delays actually achieved in response to the limits supplied in FIG. 12C. On connection C1 an actual delay of 4 nanoseconds was achieved, on connection C2, a delay of 20 nanoseconds was achieved, and on connections C3 and C4, delays of 8 and 12 nanoseconds respectively were achieved. Thus the 24 nanoseconds limit has been achieved on both paths. Note that even though the suggested limit on connection C2, $U(C2)$, was not met, the overall goal of 24 nanoseconds was achieved. This is because the layout tools which aim for the suggested limits $U(c)$ preferably do not give up if they fail to meet a suggested limit but continue to attempt to complete a solution. And since the limit on connection C1 was met with room to spare, the overall goal was met.

Lower Bounds on Delay Limits

It is unrealistic to assume delay limits can ever be zero. The shortest path between two registers will have a lower bound delay determined by the physical separation of the two registers on the chip, and by the routing segments present on the chip. The lower bound can be adjusted if blocks to be connected are placed in different physical locations (in other words, if placement is revised). But for routing changes where placement does not change, this lower bound is constant for the connection. As compared to calculating suggested limits using initial delays of zero, an improvement in the slack allocation can be achieved by starting with these lower bound delays, and adding fractions of the slack to these lower bounds. Also if analysis using the set of lower bound delays shows failure to meet a timing constraint specified by a user, this is a sure indication that the timing constraint can not be met by any routing configuration. Indeed, combining lower bound delays with timing requirements can be used to evaluate placement before further efforts at routing have been made. If the placement does not allow satisfactory routing, and the timing constraints are critical, then the placement must be revised to allow the possibility of successful routing.

Iterative Improvement Using Gap Between Achieved Delay and Lower Bounds

After an initial layout calculation is completed, total path delays and corresponding slacks can be evaluated. It may be desirable to perform an iteration to improve some of the path delays. For example, a 25% increase in clock speed may be desired. If lower bound delays as shown in FIG. 12D are used, these lower bounds can be taken into consideration when attempting an improvement in performance.

According to the invention, slacks are allocated according to the difficulty of achieving a higher standard. The remaining improvement in a connection delay is measured by the difference between the minimum delay achievable and the delay already achieved. A formula for attempted delay reduction which has worked well on several benchmark tests is to reduce the delay allowance by an amount proportional to the gap $D(c)-L(c)$ where $D(c)$ is delay achieved for the connection and $L(c)$ is the lower bound achievable delay for the connection. Thus the formula for weight, used by equation 3 in computing $f(c)$, is $$weight(c)=D(c)-L(c)$$

Equation 3 is repeated here:

$$f(c)=weight(c)/max[weights(p)] \qquad (3)$$

With the weight function of equation 7 used by equation 3, the equation 5 calculation for new delay limits $$U(c)_{new}=U(c)_{old}+(f(c) * slack(c,U)) \qquad (5)$$

thus makes use of both achieved delay and lower bound delay. Unlike the other weight functions which were considered by prior researchers, the weight function of equation 7 depends on the current state of the layout, and thus takes advantage of knowledge about what has been achieved. Since the weight function of equation 7 is the gap between the delay achieved on a connection and its lower bound, it relates to the connection's maximum potential for improvement. When an effort is then made to improve timing, upper limits $U(c)$ therefore set the amount by which each delay is asked to improve to be proportional to its potential to improve.

Figure 12F:
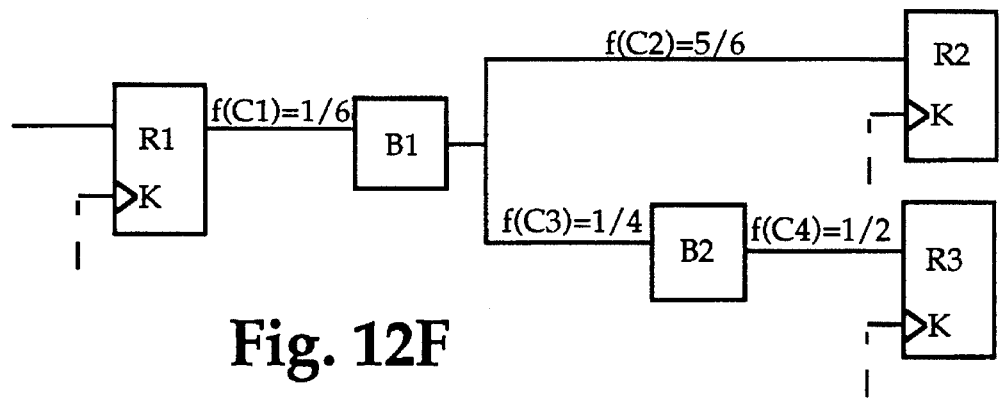
FIG. 12F shows fractions f(c) computed using lower bounds and achieved delays of FIGS. 12D and 12E.
Figure 12G:
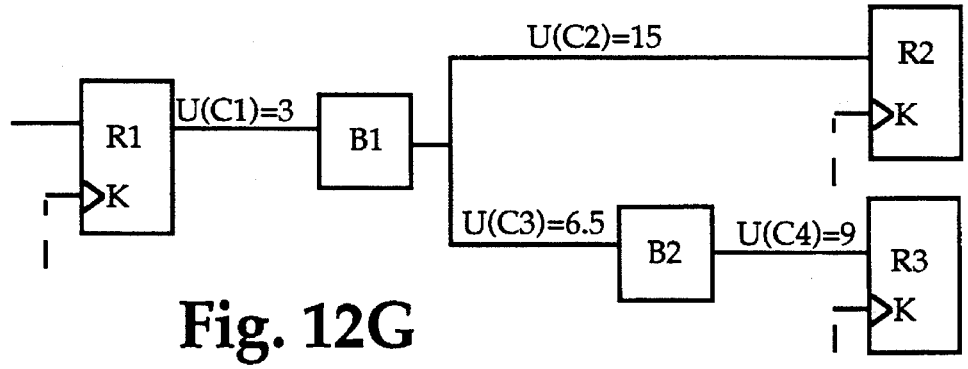
FIG. 12G shows revised upper limit time delays for the connections in the net of FIG. 12A after a tighter path constraint has been applied and new delay limits have been determined using the information from FIGS. 12D and 12E to compute the fractions f(c) of FIG. 12F.
Figure 13:
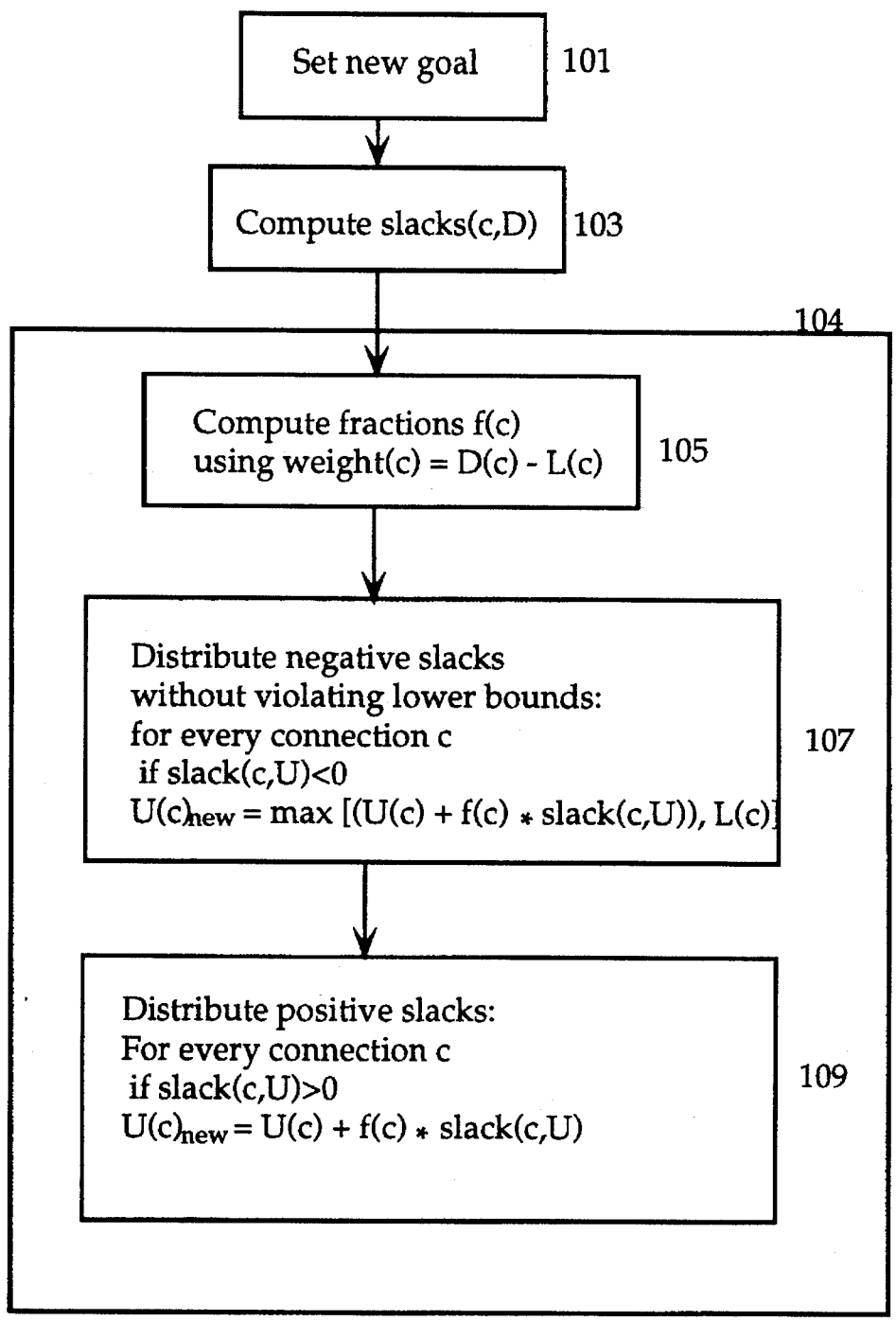
FIG. 13 shows in more detail the steps performed in step 104 of FIG. 10.

FIG. 13 shows a flow chart of steps 103 and 104 of FIG. 10, as used to improve timing of a given design. The flow chart of FIG. 13 will be discussed in conjunction with the example of FIGS. 12D, 12E and 12F. When an attempt is made to iteratively improve the timing of a design which has been laid out, the first step is to set the new goal for path time delay. In the example of FIGS. 12D–12F, the goal is to reduce the 24 nanoseconds delay by 25% to 18 nanoseconds. Since slack is the difference between achieved delay and required delay, it is clear that some slacks will initially be negative. In the example of FIG. 12D–12F, all slacks are initially negative with respect to the new requirement. For example, on connection C2, the achieved delay is 20 ns and on connection C1 the achieved delay is 4 ns. The new goal is a total of 18 ns. Thus the slacks, computed in step 103 for connections C1 and C2 are 18−24=−6. Slacks for connections C3 and C4 are also −6. As a novel feature of the invention, at step 107, negative slacks are distributed without violating lower bounds by setting the new delay limit $U(C)_{new}$ to be the greater of the value $U(C)_{old}+f(C) * slack(c,U)$ and the lower bound value $L(c)$. Thus as delay limits are reduced, no delay limit will be reduced below an achievable value. The fractions $f(c)$ shown in FIG. 12F are computed from equation 3 where weight of a connection is determined from equation 7, as discussed above. In FIGS. 12F and 12G, the actual achieved delay on connection C1 of 4 nanoseconds minus the lower bound of 2 ns results in a fraction $f(C1)$ of $2/12$ and a suggested limit of 3 ns. On connection C2, the actual delay of 20 ns and lower limit 10 ns produce a fraction $f(C2)$ of $10/12$ and a suggested delay limit of 15 ns. Similar computations are made for paths C3 and C4. Note that the 25% reduction in overall delay does not distribute to the connections as a 25% decrease uniformly. This is because the lower bound delays were not uniform. FIG. 13 shows that after negative slacks have been distributed, the distribution of positive slacks occurs at step 109 by the same method described above in connection with FIG. 12C.

Application to FPGA Routing

A preferred embodiment of the present invention is used for routing signals in an FPGA structure in conjunction with a routing tool which has the following characteristics:

1) The routing tool responds to suggested delay limits $U(c)$ by selecting for each connection c a route which meets the suggested delay limit when one is available.

2) In determining which connections to route first and in selecting routes, the routing tool uses a cost function which accounts for a combination of delay and resource costs (number of wires used of a certain type compared to the number available of that type). The routing tool makes choices based on a) suggested delay limit, b) actual delay of a proposed route, and c) number and kind of wiring segments used to form the connection.

3) When the routing tool has attempted to find routes for all connections and has failed to find some routes, the routing tool attempts to route the unrouted connections by designating an unavailable route which could complete the connection, removing (ripping up) the connections which made the route unavailable, and attempting to find routes for the temporarily unrouted connections.

Xilinx, Inc, assignee of the present patent application, supplies a router for the Xilinx XC4000 family which meets the above criteria. However, in the past, only a single upper limit for all connections has been available to the Xilinx router. The present invention supplies suggested upper limits for each connection. Guidance from this set of suggested upper limits lets the router select routes which enhance the ability of the configured device to meet faster timing requirements.

Initial Routing Solution Using Lower Bounds

If the goal is to minimize clock period, it is possible to determine the best conceivable total path delay for each of four path types (pad-to-pad, pad-to-setup, clock-to-pad, and register-to-register) by assuming all connections are routed on their fastest routes, and then select a goal for a first iteration less severe than this fastest conceivable total path delay. When used for routing a placed logic design in a logic device, connections that require special resources are routed first. The others are routed in decreasing order of the ratio of lower bound delay to allowable delay, so connections with tighter limits are routed first. The requirement may then be tightened for a second iteration.

Figure 14:
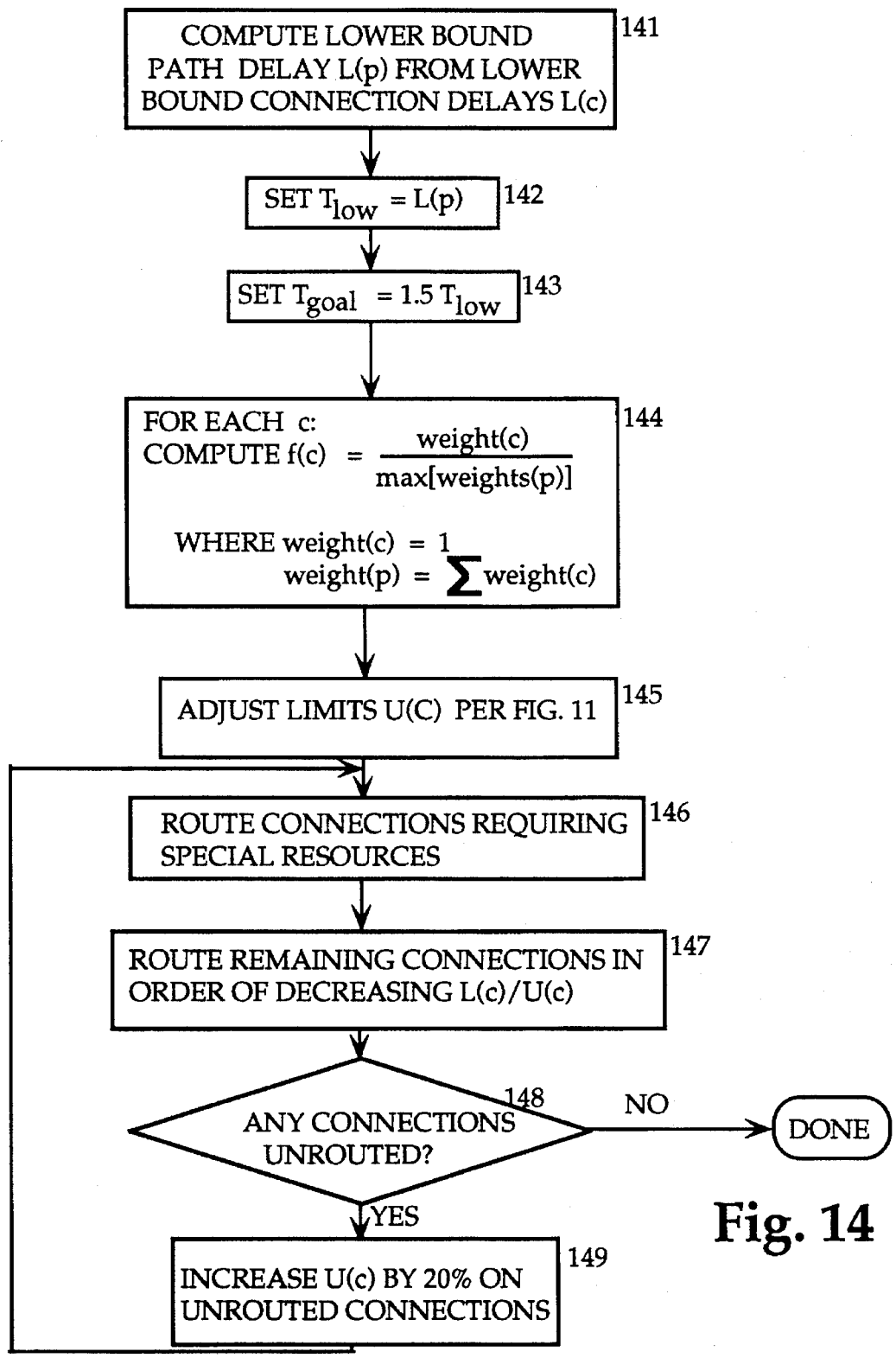
FIG. 14 shows steps performed in a first-pass calculation of routing in an FPGA device.

In detail, as shown in FIG. 14, at step 141, the path analyzer (which performs steps 103 and 104 of FIG. 10) computes lower bound path delays L(c) in order to find, at step 142, the best conceivable clock period $T_{low}$. In one embodiment, as shown in step 143, the path analyzer (the tool used in steps 103 and 104 of FIG. 10) then sets a goal (required path time) of $$T_{goal}=1.5\ T_{low}$$

As shown in step 144, for each connection c, fraction f(c) is determined from equation 3

$$f(c)=weight(c)/max\ [weights(p)] \qquad (3)$$

where the weight function used is simply the uniform slack distribution function weight (c)=1 and max [weights(p)] is the number of connections in the longest path. As shown in step 145, limits U(c) are adjusted using the limit adjusting algorithm discussed above in connection with FIG. 11.

These limits are provided to the router (this is equivalent to the arrow in FIG. 10 from step 104 to step 111), which at step 146 of FIG. 14 recognizes connections which require special resources (for example, a signal which is labeled as a global clock signal), and assigns them to the appropriate resources.

Next, at step 147, the router routes the remaining connections in order of decreasing ratio L(c)/U(c). Recall that no connections will have suggested delay limits less than their fastest possible delay L(c). Thus all ratios L(c)/U(c) will be less than or equal to 1. A ratio near 1 indicates a connection which should have a time delay near the fastest possible for that connection. Thus connections having a high ratio are routed first to increase the chance of obtaining a satisfactory route for the difficult connections. Any connections for which the router can not find a route that meets the U(c) requirement are left unrouted.

At step 148 a determination is made of whether any connections were left unrouted. If so, at step 149, the router increases the values U(c) for all unrouted connections by 20%, thus increasing $T_{goal}$ by 20%, and proceeds again to step 146. When step 148 is reached, if all connections are routed, the initial routing effort is complete, and the routing information can be supplied to the path analyzer (equivalent to the arrow between steps 102 and 103 of FIG. 10.

Improvement of an Existing Routing

Figure 15:
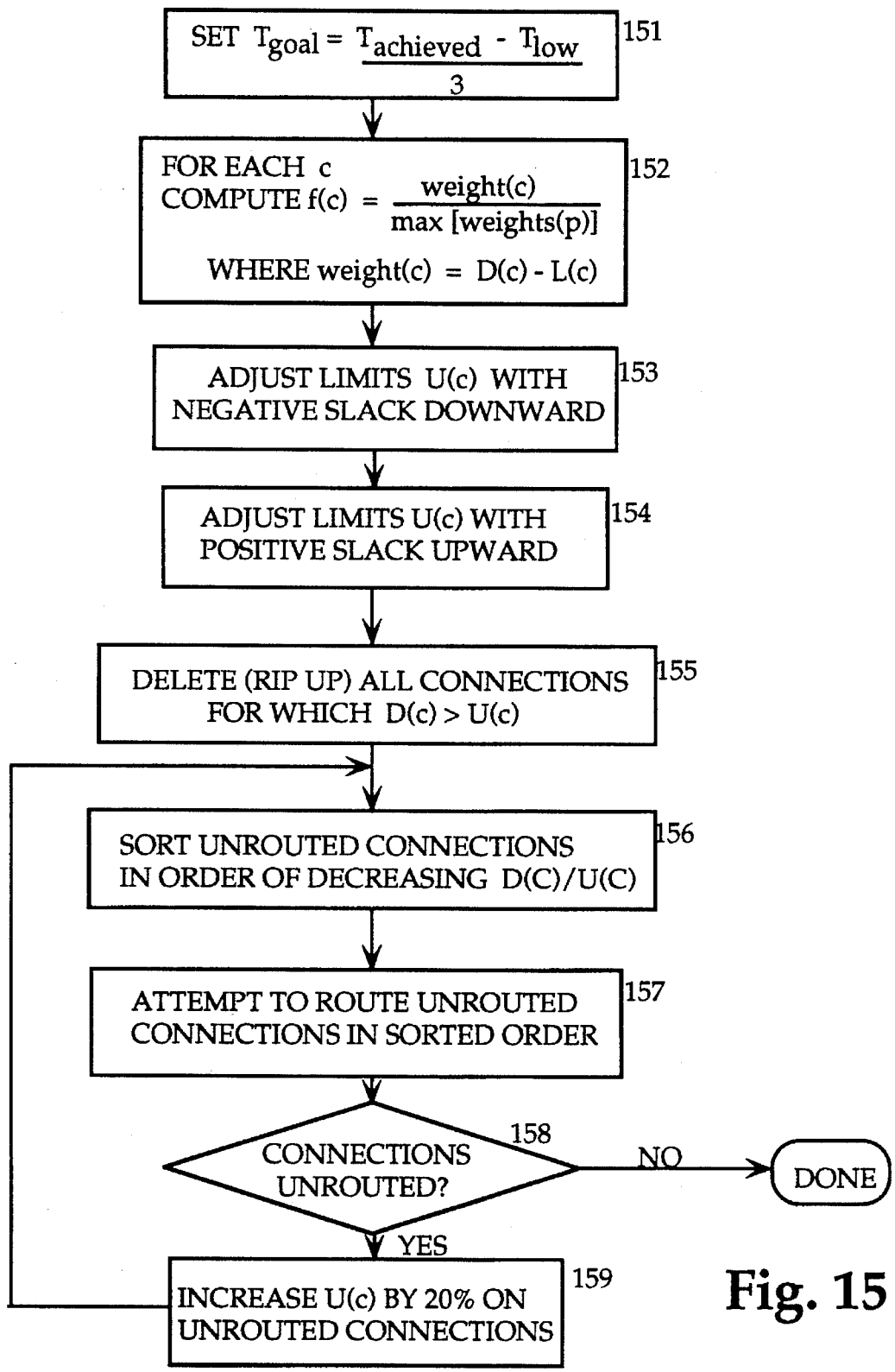
FIG. 15 shows steps performed in an iterative improvement of routing in an FPGA device.

FIG. 15 shows the steps used according to the invention to improve the timing of an existing routing solution. The existing routing solution will have an achieved clock speed $T_{achieved}$. If the intent is to obtain the fastest possible solution, a preferred embodiment attempts on one iteration to reduce the clock period by one third of the maximum possible decrement. Thus in step 151, a new clock period $T_{goal}$ is set $$T_{goal}=T_{achieved}-(T_{achieved}-T_{low})/3 \qquad (8)$$

As indicated in step 152, for each connection c, the fraction f(c) is computed from equation 3

$$f(c)=weight(c)/max\ [weights(p)] \qquad (3)$$

where the weight function used is now the achieved delay minus lower bound delay, or room for improvement:

$$weight(c)=D(c)-L(c) \qquad (7)$$

After these fractions f(c) have been determined, at step 153, those limits U(c) with negative slack are adjusted downward using the formula (b) $U(c)_{new}=max\ [U\ (c)_{old}+f(c) * slack\ (c,U)),\ L(c)]$; then at step 154, those limits with positive slack are adjusted upward, using the formula $$U(c)_{new}=U(c)_{old}+f(c)\ slack(c,U) \qquad (5)$$

These new and sometimes tighter suggested delay limits are provided to the router, which at step 155, deletes or rips up all routes for connections having a delay D(c) higher than the new suggested limit U(c).

At step 156, the router sorts these now unrouted connections in order of decreasing D(c)/U(c), so that those having delays most exceeding their new limits can be routed first. At step 157, the router attempts to route these unrouted connections in the sorted order. Any connections which fail to meet the U(c) requirement are temporarily left unrouted.

At step 158 the router determines whether any connections now remain unrouted, and if so, at step 159, increases U(c) for those unrouted connections by 20%. Steps 156 and 157 of sorting and attempting to route are then repeated. This loop repeats until all routes are completed.

Results of Timing Improvement During Routing

It is often possible to achieve improved timing with this routing improvement method. An experiment with 22 benchmark designs of varying sizes and functions compared delays resulting from a routing algorithm which uses a single delay limit for all connections with delays resulting from using the limit adjusting algorithm which used lower bounds, followed by one pass of the routing improvement algorithm discussed above. Results showed improvement in every case when compared with the timing results using the single delay limit. Percentage timing improvement ranged from 3% to 32% with an average of about 14% for the 22 benchmark designs. Comparison of the achieved connection delays with theoretical minimum connection delays showed that only an additional 16% improvement in routing delay could ever be obtained if every connection were routed on its fastest route. Further improvement in timing for these 22 designs, as well as for other designs may be achieved by using the invention with initial placement or placement improvement when laying out the design. Such improvement has not yet been tested.

The flow diagram of FIG. 10 applies at all these stages. Since little is known about actual delay during early stages of placement, the lower bounds are only estimates. But computing suggested limits from these early estimates does improve later placement results. We will next discuss the applications of the path analysis method to earlier stages in the layout process.

Initial Placement

The method of the present invention can also be used with initial placement of logic elements into logic blocks. Initial placement is preferably performed by a min-cut partitioning algorithm which begins by dividing the complete design into two clusters to be implemented in two regions of the device. The mincut algorithm tries to minimize the number of connections extending across a cut line dividing the two regions. The min-cut algorithm continues to divide one cluster into two smaller clusters, until each cluster can be implemented in one logic block.

Each partitioning of one cluster of elements into two begins by placing half the logic elements on each side of the cut line. Then follows a sequence of steps in which each element in turn changes sides. At each step, the element selected to move across the cut line is the one that can effect the greatest cost reduction by moving to the other side.

Figure 16:
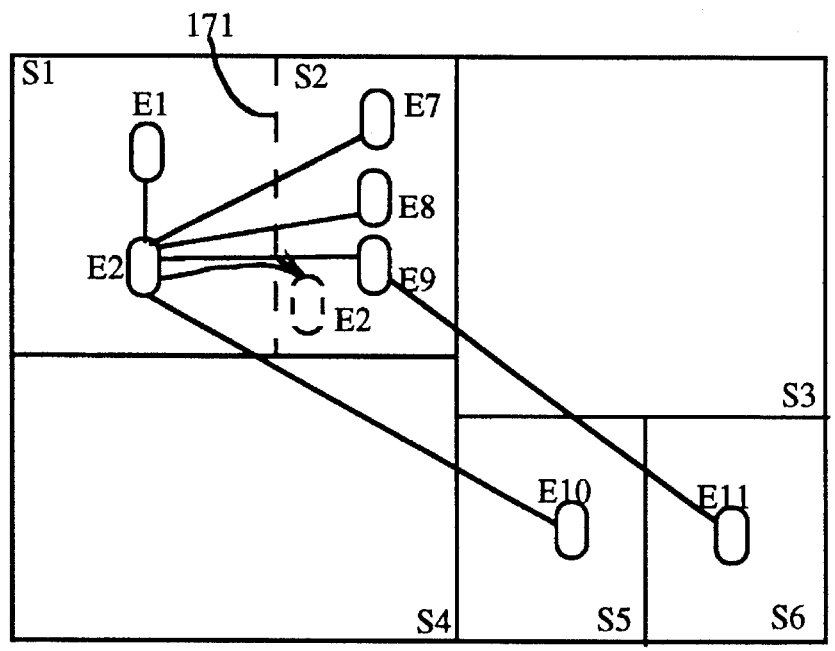
FIG. 16 illustrates a sample problem for illustrating the mincut partitioning algorithm which may be used during initial placement.

In the prior art min-cut algorithm, the cost of a particular arrangement of elements around a cut line is the estimated number of connections crossing that line (estimated because the actual number of connections in general depends upon final routing for sets of multiple connections which fan out from a single source). FIG. 16 illustrates a small example in which the cost of moving element E2 across cut line 171 from section S1 to S2 will be evaluated.

After all elements are moved from one side to the other, the step within the sequence at which the lowest cost was attained is adopted as a new proposed partition. The process is then repeated, again moving each element across the cut line in turn and selecting the arrangement with the lowest cost. Repetitions of the process of moving each element and selecting the arrangement with the lowest cost continue until a sequence occurs with no further improvement.

The present invention evaluates cost of moving an element across a cut line based not only on improvement in number of connections crossing the cut line but also on a delay calculation.

$$\text{Cost}_E = N_{after} - N_{before} + C_{delay}(E) \quad (9)$$

where $\text{Cost}_E$ is the cost of moving an element E across the cut line (a negative number indicates an improvement);

$N_{after} - N_{before}$ is the prior art connection crossing cost: the estimated number of connections extending across the cut line after the element is moved minus the number of connections extending across the cut line before the element is moved; and $C_{delay}(E)$ is the cost addition related to delay for moving that element across the cut line.

Figure 17A:
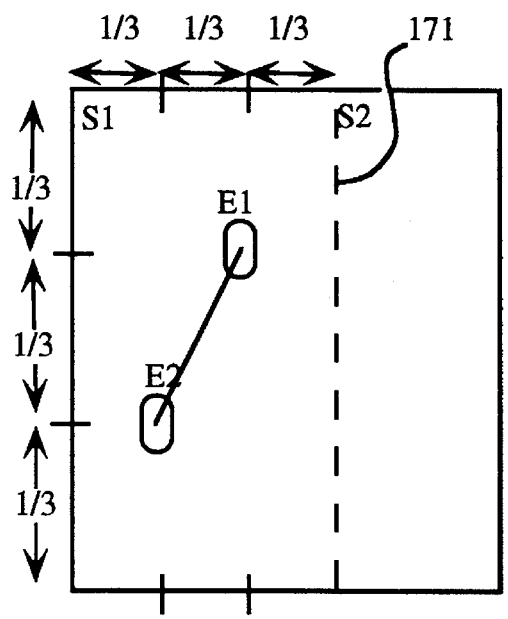
FIG. 17A represents the assumed placement when estimating actual delays on connections which do not cross a partitioning line during initial placement.

According to the present invention, $C_{delay}(E)$ is the sum of connection delay functions $C_{delay}(c)$ for connections to element E. That is, $$C_{delay}(E) = \Sigma\, C_{delay}(c) \quad (10)$$

for all connections c that attach to element E. According to a preferred embodiment of the invention, the connection delay function $C_{delay}(c)$ is a function of suggested delay limits U(c) as calculated in step 104 of FIG. 10 described above, and also of two values B(c) and W(c). The value B(c) represents the better situation, e.g. where the connection does not cross the cut line, and the value W(c) represents the worse situation, e.g. where the connection c does cross the cut line. FIG. 17A illustrates the better situation in which a connection between elements E1 and E2 does not cross a cut line 171, and FIG. 17B illustrates a worse situation in which element E2 has been moved such that the connection between elements E1 and E2 does cross the cut line 171.

In the case of FIG. 17A, where the connection does not cross the cut line, to determine the delay for connection E1–E2, elements E1 and E2 are assumed to be separated by ⅓ the x dimension and ⅓ the y dimension of the region to the left of cut line 171. Better case delay B(c) corresponding to these coordinates is looked up in a table of estimated delays which is specific to the chip being used. Estimated delays stored in the table are determined by assuming that the connection will be routed between its elements using the fastest route in the chip excluding any chip routing resources which have been designated as fast resources. Typically delay depends upon the particular resources and transistors in the chip and is not proportional to the distance between the logic blocks where the elements are located. In some Xilinx FPGA chips, for example, global clock buffer lines and other long lines extending a full dimension of the chip, or in some cases half the dimension of the chip, relatively few of these fast resources are provided because they occupy significant chip area, and they are designated as fast resources so that they can be recognized by the layout tools as resources intended for fast use such as clocks and high fan-out lines. These fast resources are not available to the large number of connections in a chip. Therefore the best estimate of connection delays assumes these fast resources are not available. In one embodiment, the estimated delays placed in the estimated delay table also assumes that wiring segments which are used to form a connection are not interconnected through buffers to regenerate and sometimes speed up the signal. Thus the estimated delay table is a fairly conservative table. For some chips available today, estimated delay is in the range of 1 to 20 nanoseconds.

Figure 17B:
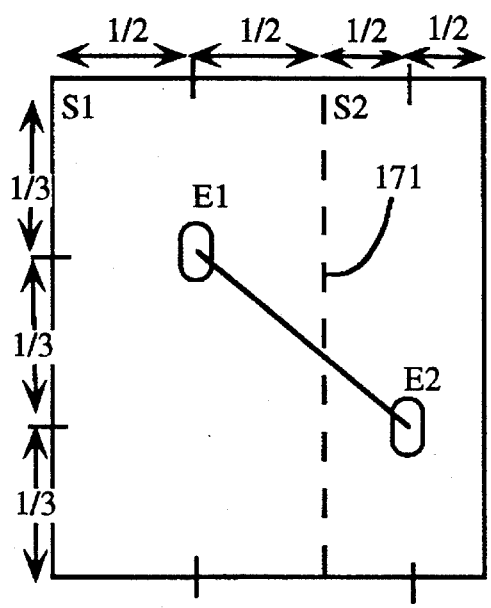
FIG. 17B represents the assumed placement when estimating actual delays on connections which do cross a partitioning line during initial placement.

In the case of FIG. 17B, where the connection does cross vertical cut line 171, elements E1 and E2 are assumed to be at the midpoints of the horizontal dimensions of the portions, and at the ⅓ and ⅔ points of the vertical dimension. Worse case delay W(c) corresponding to the coordinates of elements E1 and E2 as positioned in FIG. 17B is also looked up in the table of estimated delays. As stated above the cost $C_{delay}(c)$ is a function of suggested delay limit U(c), better case delay B(c) and worse delay W(c). The presently preferred function is $$\text{If } W(c) < U(c)/2,\ C_{delay}(c)=0\ \text{If } U(c) > W(c) > U(c)/2,\ C_{delay}(c) = W(c) - B(c)\ \text{If } W(c) > U(c),\ C_{delay}(c) = W(c) - B(c) + [W(c) - \text{greater of } B(c), U(c)]. \quad (11)$$

That is, if the delay caused by crossing the cut line is still far below the suggested limit, a factor relating to $C_{delay}(c)$ will not be added to $C_{delay}(E)$ for evaluating the cost of moving the element. If the delay caused by the connection crossing the cut line is close to but below the suggested delay limit U(c), then a number chosen to reflect the cost incurred by crossing the cut line, namely the difference between expected delay when the cut line is crossed and expected delay when the cut line is not crossed, is contributed to $C_{delay}(E)$. If the worse case delay exceeds the suggested delay limit U(c), then a second contribution resulting from $C_{delay}(c)$ is added to $C_{delay}(E)$. This additional contribution is the smaller of two differences: the difference between worse case delay and suggested delay limit (or how badly the limit is exceeded in the worse case) and the difference between worse case and better case delay (relates to the possibility for improvement).

If W(c) corresponds to the state before the move and B(c) corresponds to the state after the move, then $C_{delay}(c)$ is recorded as a negative number. In the example of FIG. 16, negative values of $C_{delay}(c)$ will occur for all connections from E2 except E1. Thus movement of E2 from section S1 to S2 will likely show a negative total and thus an improvement (unless element E1 is the only element with worse case delay W(c)>U(c)/2).

Regarding equation 9 above, note that units of $C_{delay}(c)$ and $C_{delay}(E)$ are time units whereas units of the number of cut line crossings $N_{after}$-$N_{before}$ are pure numbers. In one embodiment, the conversion of units is made by specifying units of $C_{delay}(C)$ in tenths of nanoseconds, and adding the resultant $C_{delay}(E)$ to the number $N_{after}$-$N_{before}$.

In another embodiment, the fact that successive cut lines divide smaller areas is taken into account by multiplying $N_{after}$-$N_{before}$ by a factor proportional to the dimension which is being partitioned by the cut line. Thus the formula for cost of moving an element becomes $$\text{Cost}_E = S * (N_{after} - N_{before}) + C_{delay}(E) \qquad (9a)$$

where

S represents the dimension (measured in number of rows or columns) of the portion being partitioned perpendicular to the cut line, which is related to the physical separation the cut line is likely to cause.

The cost of moving an element across a cut line is calculated for each element in the portion being partitioned, and for each element the effect of each connection to that element is considered.

The flow of steps shown in FIG. 10 when using the suggested limits of the present invention for initial placement using a mincut partitioning algorithm is to cycle through steps 102, 103, 104, and 111 once for each cut line. Thus the calculation of suggested limits U(c) is performed many times during the initial placement activity. In one embodiment, the path analysis steps 103 and 104 are repeated for all successive cut lines until initial placement is completed. In another embodiment, the suggested limits are not recomputed (using steps 103 and 104 of FIG. 10) after the cut lines dividing the first several clusters are determined. For example, in a logic array chip having 256 logic blocks, the first partitioning will divide the logic into two groups occupying about 100–150 logic blocks, then the second and third cut lines will divide the logic into groups occupying about 50–75 logic blocks each. Fourth, fifth, sixth, and seventh cut lines will divide the logic into groups occupying about 25 to 50 logic blocks each. It may be decided to cease the path analysis steps 103 and 104 after the seventh or fifteenth cut lines have been completed, and perform the remaining partitioning using delay limits computed earlier, thus saving calculation time. Lower bounds will be lower than would be calculated using updated partitioning information, but the benefit of earlier lower bounds greater than zero reflected in earlier calculated suggested delay limits U(c) will continue through subsequent partitioning steps. Calculation of better and worse case delays performed in step 111 may continue for subsequent partitioning steps even if iterating through steps 103 and 104 of the path analysis is discontinued.

Figure 18:
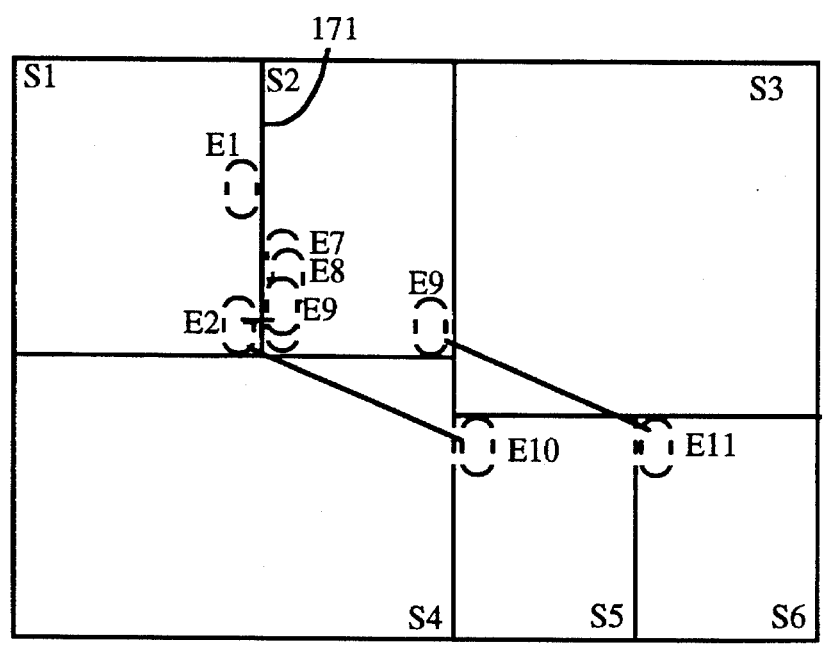
FIG. 18 represents the assumed placement when estimating lower bound delays during initial placement.

Suggested delay limits U(c) are calculated at step 104 of FIG. 10 using lower bound delays L(c) just as was done in other examples discussed earlier, for example during routing. However, accurate lower bound numbers are not yet known since elements are not yet placed. FIG. 18 illustrates the assumed lower bound connection delays for elements shown in FIG. 16 for use in the suggested limit calculation of step 104. FIG. 18 represents the layout after cut line 171 is established. For the purpose of illustration, in FIG. 18, element E2 remains in section S1. In calculating lower bound connection delays L(c), the elements are assumed to be in that part of the region closest to the elements they connect to. This means the lower bound connection extends from a different part of a region depending upon where the connection extends. For element E9, for example, the element is shown in the lower right corner of region S2 for connection E9–E11 and E9 is shown at the left edge of section S2 for connection E2–E9. Therefore, at this stage of the partitioning, in step 104 of FIG. 10, only connections E2–E10 and E9–E11 show a significant lower bound delay resulting from the partitioning. Other connections are shown as having a minimal delay corresponding to the closest possible logic blocks. Connection delays are taken from the table of delays for the minimum distances shown. These lower bound delays are then used in calculating a suggested connection delay limit, for example U(E2–E10) for connection E2–E10.

A Placement Improvement Algorithm—Use of Suggested Limits

Figure 19:
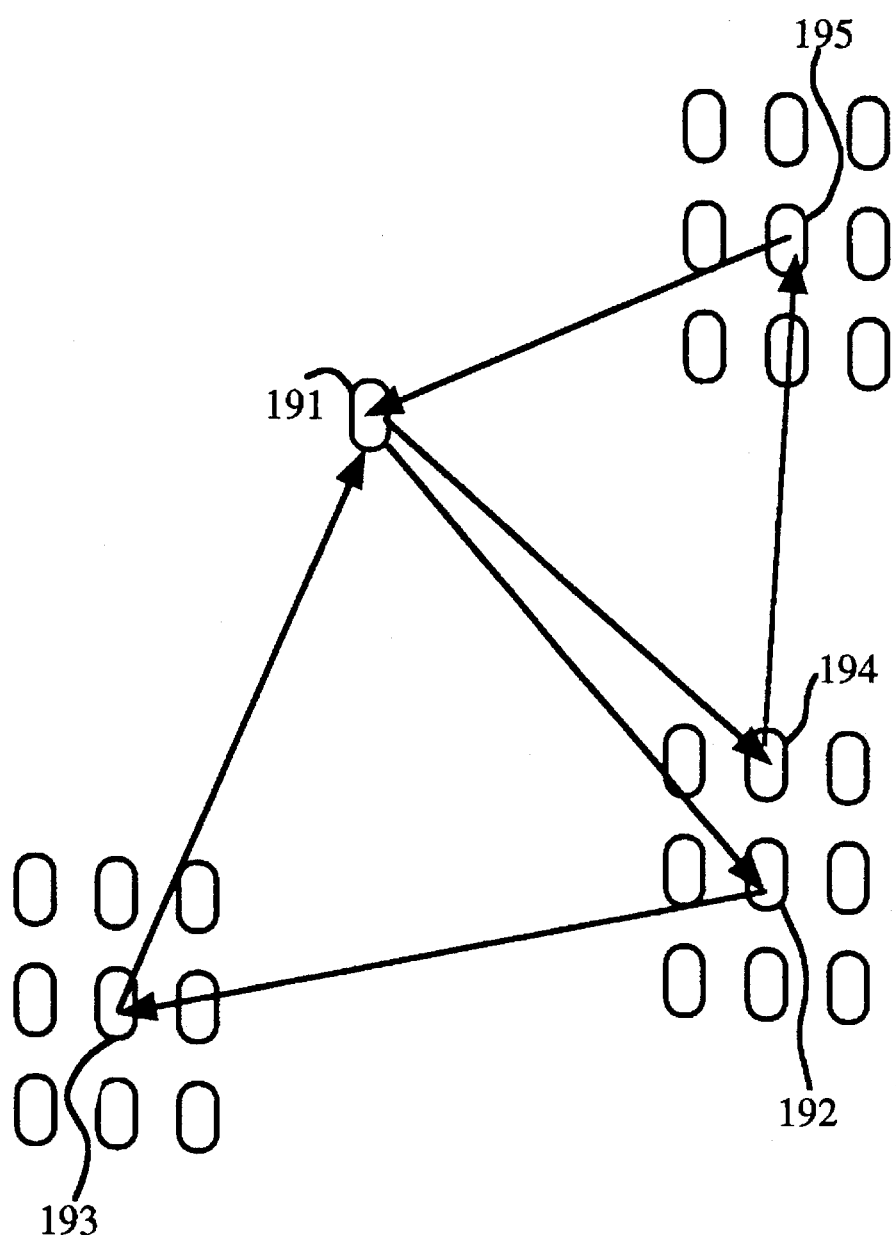
FIG. 19 illustrates a subset of candidate elements to be cycled during placement improvement.

One placement improvement algorithm with which the present invention is used is a cycling of elements among three positions. Considering the context of FIG. 10, placement improvement occurs at step 111. During step 111, each logic element in the logic design is considered for movement to another place. The placement improvement algorithm cannot depend on finding an empty place to move an element, so, in general, placement improvement involves swapping two logic elements or cycling several logic elements. The following description relates to cycling three elements. FIG. 19 shows element 191 being considered for a change in placement. Element 192 is in the prime candidate place. But moving element 192 to allow placement improvement for element 191 may have a harmful effect overall. Therefore, other neighbors of element 192, in one embodiment eight neighbors, are also considered for the new position of element 191. Element 194, for example, is considered along with element 192 as a place to move element 191. For each of nine elements, including elements 192 and 194, the most desirable new location for movement is also considered, along with neighbors. For element 192, the most desirable move is to the location of element 193, which can then be moved to the location of element 191, completing the triangle. For element 194, the most desirable element is 195. Thus to evaluate moves for element 191, 81 triangles can be considered, and a best is chosen.

In a prior art embodiment this prime candidate destination for element 191 is the center of gravity of those elements having connections to element 191. In an embodiment using the present invention, the prime candidate for movement of element 191 is the place having the lowest timing cost for connections to element 191. In yet another embodiment the prime candidate 192 is in a place midway between the center of gravity of 191's connections and the place having the lowest timing cost for connections to element 191. Many other combinations of these two means of selecting a prime candidate for moving an element can be used. A presently preferred method uses the place midway between the prior art center of gravity and the place having the lowest timing cost. Suggested delay limits U(c) from step 104 are used to calculate this timing cost.

Figure 20:
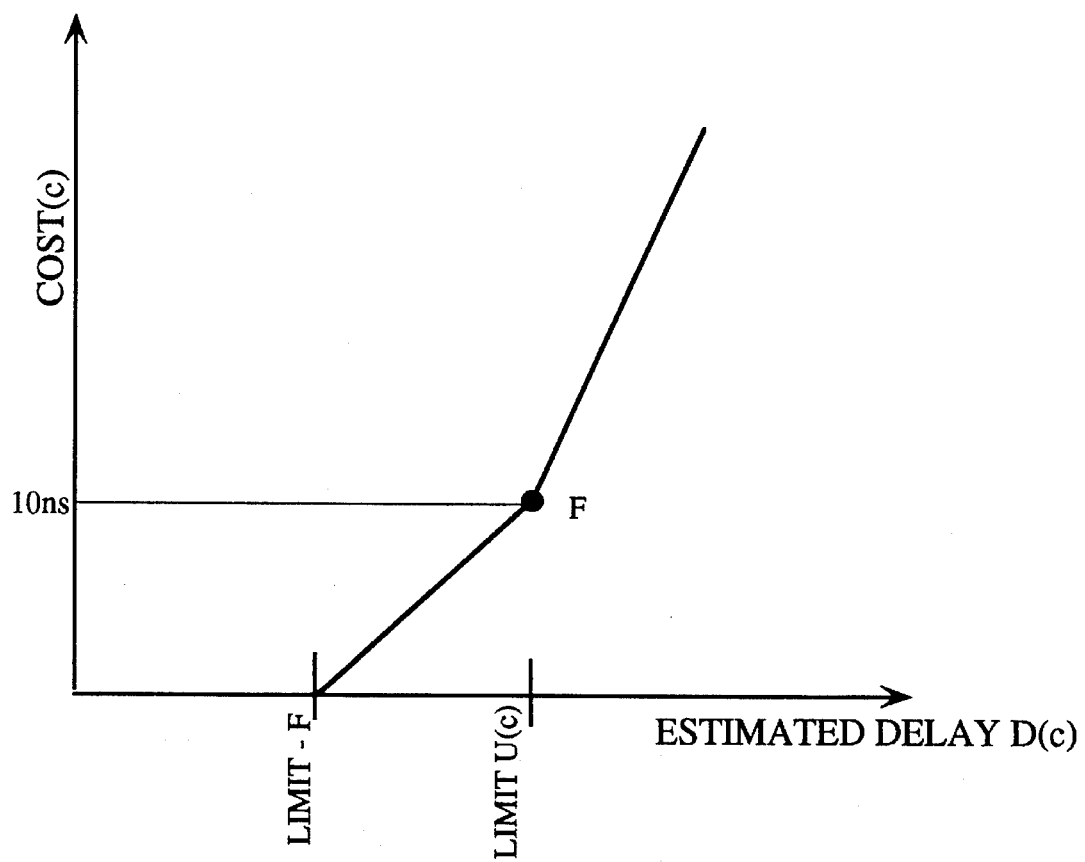
FIG. 20 illustrates a cost function used during placement improvement.

FIG. 20 shows how the cost of a particular placement is computed by comparing estimated delays D(c) on the connections to suggested delay limits U(c) for those connections. Estimated delays are stored in another table. The table of estimated delays is determined by assuming that the fastest routing resources in a chip having routing resources of more than one speed are unavailable. Several chips commercially available have a limited number of very fast routing resources, and because of their scarcity these resources are generally not available for most connections. For estimating delay it is thus reasonable to assume these fast resources are unavailable.

The x and y coordinates of the prime candidate destination are calculated from the following formulas:

$$G_x = \Sigma[\text{cost}(c) * X(c)] / \Sigma[\text{cost}(c)] \quad (12)$$

$$G_y = \Sigma[\text{cost}(c) * Y(c)] / \Sigma[\text{cost}(c)] \quad (13)$$

where cost (c) is the timing cost of a connection c attached to the element being moved, X(c) is the X coordinate of the element at the other end of the connection, Y(c) is the Y coordinate of the element at the other end of the connection and the summation is performed over all connections c which connect to the element being moved. The timing cost, cost (c) is illustrated in FIG. 20. Cost (c) equals a fixed delay F (for example 10 ns) whenever estimated delay is equal to the suggested delay limit U(c). For smaller estimated delay, cost (c) decreases linearly, reaching zero when estimated delay is U(c) - F. For estimated delays greater than U(c), cost(c) increases linearly with a slope greater than 1. Of course other values than 10 ns may be selected for the cost at the delay limit, and will depend upon the speed of the part among other factors. One preferred slope is 2.0, though other slopes may be preferred after further testing.

As illustrated in FIG. 19, some collection of alternative positions close to the prime candidate destination is preferably evaluated in order to find the best triangle for cycling of element 191. It is clear from the above description that many different methods for selecting alternatives to the prime candidate can be used.

The placement improvement algorithm calculates estimated connection delay lower bounds for the new placements after all elements in the design are evaluated for movement and improved placements have been determined (step 111 of FIG. 10). As shown in FIG. 10, these new lower bound delays are provided to the path analysis tools which again compute suggested delay limits U(c). In one embodiment, the default number of cycles through the steps of FIG. 10 for placement improvement is three.

At steps 103 and 104, resulting slacks are computed and delay limits are suggested. These suggested delay limits are then used by the placement improvement algorithm to evaluate the next move of an element, and thus to improve the selected placement. If a path is determined to have low slack, the suggested delay limits computed at step 104 will be used by the placer at step 111 to select the next move so the delay limits can be met. The placer gives higher weight to connections having tight limits so that elements attached by critical connections are less likely to be separated by a slow connection.

During placement improvement, lower bound delays assuming the fastest possible connections between placed elements can be estimated at step 102 by assuming the elements are routed on the fastest possible routes available for connecting the logic blocks in which the connected elements are placed. As discussed above under initial placement, lower bound connection delays are looked up in a table. (The table may be a function of x and y distances between the two elements or may be a function of the x and y coordinates of the two elements). For lower bound delays, it may be assumed that multiple connections can have access to the same physical lines. After step 102, the set of lower bound connection delays is communicated to the path analysis tool, which at step 103 computes lower bound path delays and slacks, and at step 104 computes new suggested delay limits U(c) for the connections.

The path analysis tool can also compute a corresponding lower bound clock period. This is the minimum clock period which could be used to operate the device if every connection were routed on its fastest route. An error message is returned to the user if a clock period lower than this lower bound has been requested. Based on suggested limits computed at step 104, the placer at step 111 will then attempt a set of alternative placements which will meet the suggested delay limits resulting from the desired clock period. In one embodiment, the placer will continue to operate and find the best available placement if the lower bound delays indicate that timing constraints can not be met.

Other embodiments will become obvious to those skilled in the art in light of the above disclosure, including methods for determining delay limits useful for mask programmed devices and custom devices. Such embodiments are intended to fall within the scope of the present invention.

We claim:

1. A method for laying out a logic design made up of logic elements and connections onto a logic device having logic blocks, wire segments, and means for connecting said wire segments to form routes, comprising the steps of:

specifying said logic design in machine readable form;

placing each of said logic elements into one of said logic blocks;

estimating lower bound connection delays L(c) for connections in said logic design;

selecting delay limits U(c) for each of said connections, each of said delay limits being selected to be greater than or equal to a corresponding one of said lower bound connection delays;

routing said connections wiring segments of said logic device to connect said logic elements which have been placed in said logic blocks, for which actual delays D(c) result, said routing step being performed such that at least some of said delay limits U(c) are not exceeded by said actual delays D(c).

2. A method for laying out a logic design onto a logic device as in claim 1 comprising the further step, after said step of routing of said connections along wiring segments, of:

deleting any completed routes which do not meet said revised delay limits, and routing unrouted connections in order of decreasing ratio of lower bound to delay limit.

3. A method for laying out a logic design made up of logic elements and connections onto a logic device having logic blocks, wire segments, and means for connecting said wire segments to form routes, comprising the steps of:

specifying said logic design in machine readable form;

estimating lower bound connection delays L(c) for connections in said logic design;

selecting delay limits U(c) for each of said connections, each of said delay limits being selected to be greater than or equal to a corresponding one of said lower bound connection delays;

performing a layout step for which actual or estimated actual delays D(c) result, said layout Step being performed such that at least some of said delay limits U(c) are not exceeded by said actual or estimated actual delays D(c);

computing said actual or estimated actual delays D(c);

computing revised delay limits Ur(c), said revised delay limits being a function of said lower bounds L(c) and said actual or estimated actual delays D(c);

performing a next layout step on said logic design using said revised delay limits Ur(c): and completing the layout of said logic design onto said logic device.

4. A method for laying out a logic design onto a logic device as in claim 3 in which each of said revised delay limits is a function of slack S(c) for that connection, slack S(c) being the difference between earliest required signal arrival time R(c) of that connection and latest actual signal arrival time A(c) of that connection.

5. A method for laying out a logic design onto a logic device as in claim 4 in which said revised delay limits are computed from the formula $$Ur(c)=D(c)+f(c) * S(c)$$

where

Ur(c) represents said revised delay limits;

f(c) is a fraction less than or equal to 1; and

S(c) is said slack.

6. A method for laying out a logic design onto a logic device as in claim 5 comprising the steps performed after said step of computing revised delay limits of iteratively:

again calculating said slacks S(c); and if said slacks S(c) are not sufficiently near zero, further revising said revised delay limits by the formula $$Ur(c)_{new}=Ur(c)_{old}+f(c) * S(c)$$

until said slacks are sufficiently near zero.

7. A method for laying out a logic design onto a logic device as in claim 5 in which said fraction f(c) is computed from the formula $$f(c)=weight(c)/max (weight(p))$$

where weight(c)=D(c)−L(c);

weight(p)=Σ weight(c) for all connections c on a path p; and max (weight(p)) is weight(p) on the path with maximum weight that includes connection c.

8. A method for laying out a logic design onto a logic device as in claim 3 in which said layout step comprises selecting a route to implement each said connection.

9. A method for laying out a logic design onto a logic device as in claim 8 comprising the further steps, after said step of computing revised delay limits, of:

deleting any completed routes which do not meet said revised delay limits, and routing unrouted connections in order of decreasing ratio of said estimated delay D(c) to delay limit U(c).

10. A method for laying out a logic design onto a logic device as in claim 3 in which said layout step comprises placing logic elements in corresponding logic blocks.

11. A method for laying out a logic design onto a logic device as in claim 10 comprising the further step after said step of computing revised delay limits of placing logic elements in corresponding logic blocks so as not to violate said revised delay limits.

12. A method for laying out a logic design made up of logic elements and connections onto a logic device having logic blocks, wire segments, and means for connecting said wire segments to form routes, comprising the steps of:

a) specifying said logic design in machine readable form;

b) selecting delay limits U(c) for each of said connections;

c) performing an initial placement step for which estimated delays D(c) result, said initial placement step being performed using a modified min-cut partitioning algorithm which determines whether a logic element shall be moved across a cut line based on the following objectives:

1) minimizing the number of connections to said logic element crossing said cut line, and 2) minimizing the number of said connections to said logic element for which said delay limit U(c) is exceeded by said estimated delay D(c); and e) completing the layout of said logic design onto said logic device.

13. A method for laying out a logic design as in claim 12 in which said objective (2) minimizes estimated delay on at least one path of which at least one of said connections to said logic element is a part.

14. A method for laying out a logic design as in claim 12 in which said objective (2) minimizes the sum of timing costs on connections to said element.

15. A method for laying out a logic design as in claim 14 in which each of said timing costs is a function of said delay limits U(c), and also a function of worse case delay w(c) of a connection which crosses said cut line and better case delay B(c) of a connection which does not cross said cut line.

16. A method for laying out a logic design as in claim 15 in which said worse timing cost W(c) and said better timing cost B(c) are functions of estimated delays computed by assuming that a route used by said connection is the fastest route available to that connection without using routing resources in said logic device specifically designated to be fast.

17. A method for laying out a logic design as in claim 15 wherein said function of worse case delay W(c) and better case delay B(c) is a function of the difference between said worse case delay W(c) and said better case delay B(c).

18. A method for laying out a logic design as in claim 17 in which said function of the difference, $C_{delay}(c)$, is determined as follows:

if $W(c)<U(c)/2$, $C_{delay}(C)=0$;

if $U(c)>W(c)>U(c)/2$, $C_{delay}(c)=W(c)-B(c)$;

and if $W(c)>U(c)$, $C_{delay}(C)=W(c)-B(c)+(W(c)-(greater of B(c),$

U(c)).

19. A method for laying out a logic design made up of logic elements and connections onto a logic device having logic blocks, wire segments, and means for connecting said wire segments to form routes, comprising the steps of:
  a) specifying said logic design in machine readable form;
  b) selecting delay limits U(c) for each of said connections;
  c) determining estimated delays D(c) for each of said connections;
  d) performing a placement improvement step comprising cycling at least three logic elements between a set of at least three positions, in which at least two of said logic elements are assigned to positions as a function of timing costs associated with connections attached to said at least two logic elements, timing cost cost(c) of each said connection being a function of:
    1) a corresponding delay limit U(c), and
    2) a corresponding estimated delay D(c); and
  e) completing the layout of said logic design onto said logic device.

20. A method for laying out a logic design as in claim 19 in which said estimated delay D(c) assumes a route for each connection c is the fastest route available to that connection without using routing resources in said logic device specifically designated to be fast.

21. A method for laying out a logic design as in claim 19 in which said function of timing costs includes the sum of said timing costs cost(c) for all connections to one of said at least two logic elements.

22. A method for laying out a logic design as in claim 19 in which each position selected for a logic element as a function of timing costs is selected from the formulas $$G_x = \Sigma(\text{cost}(c) * X(c)/\Sigma(\text{cost}(c))$$

$$G_y = \Sigma(\text{cost}(c) * Y(c)/\Sigma(\text{cost}(c))$$

where
  cost(c) is the timing cost of a connection c attached at one end to said logic element,
  X(c) is the X coordinate of the logic element at another end of said connection c,
  Y(c) is the Y coordinate of the logic element at another end of said connection c; and
  said summation $\Sigma$ is performed over all connections c which connect to said logic element.

23. A method for laying out a logic design as in claim 22 in which each of said timing costs cost (c)
  is equal to a set value F when said estimated delay D(c) is equal to said delay limit U(c),
  decreases to zero as a first function of the difference D(c) - U(c) for estimated delay D(c) less than U(c), and
  increases as a second function of estimated delay D(c) minus delay limit U(c) for estimated delay greater than said delay limit.

24. A method for laying out a logic design as in claim 23 in which said first function is F+D(c)−U(c), and said second function is F+(2 * (D(c)−U (c))).

25. A method for laying out a logic design made up of logic elements and connections onto a logic device having logic blocks, wire segments, and means for connecting said wire segments to form routes, comprising the steps of:
  specifying said logic design in machine readable form;
  selecting delay limits U(c) for each of said connections;
  performing a layout step for which estimated delays D(c) result, said layout step being performed such that at least some of said delay limits U(c) are not exceeded by said estimated delays D(c);
  computing said estimated delays D(c);
  computing revised delay limits Ur(c) for each of said connections, said revised delay limits being a function of said estimated delays D(c);
  performing a next layout step on said logic design using said revised delay limits Ur(c); and
  completing the layout of said logic design onto said logic device.

26. A method for laying out a logic design as in claim 25 comprising the further step of:
  estimating lower bound connection delays L(c) for connections in said logic design;
  and in which
  said step of selecting delay limits U(c) for each of said connections is performed such that each of said delay limits is selected to be greater than or equal to a corresponding one of said lower bound connection delays; and
  said step of computing revised delay limits Ur(c) is performed such that said revised delay limits are also a function of said lower bounds L(c).

* * * * *